(12) United States Patent
Lin et al.

(10) Patent No.: US 11,810,936 B2
(45) Date of Patent: Nov. 7, 2023

(54) PIXEL ARRAY INCLUDING AIR GAP REFLECTION STRUCTURES

(71) Applicant: Taiwan Semiconductor Manufacturing Company, Ltd., Hsinchu (TW)

(72) Inventors: ChunHao Lin, Tainan (TW); Feng-Chien Hsieh, Pingtung (TW); Yun-Wei Cheng, Taipei (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 132 days.

(21) Appl. No.: 16/949,927

(22) Filed: Nov. 20, 2020

(65) Prior Publication Data

US 2022/0165776 A1 May 26, 2022

(51) Int. Cl.
*H01L 27/146* (2006.01)
(52) U.S. Cl.
CPC .. *H01L 27/14629* (2013.01); *H01L 27/14685* (2013.01); *H01L 27/1463* (2013.01); *H01L 27/1464* (2013.01); *H01L 27/14623* (2013.01)

(58) Field of Classification Search
CPC ......... H01L 27/14629; H01L 27/14685; H01L 27/14623; H01L 27/1463; H01L 27/1464
See application file for complete search history.

(56) References Cited

U.S. PATENT DOCUMENTS

2011/0049589 A1* 3/2011 Chuang ............. H01L 27/14609
257/292

* cited by examiner

*Primary Examiner* — Mounir S Amer
*Assistant Examiner* — Alexander Belousov
(74) *Attorney, Agent, or Firm* — Harrity & Harrity, LLP

(57) ABSTRACT

A pixel array may include air gap reflection structures under a photodiode of a pixel sensor to reflect photons that would otherwise partially refract or scatter through a bottom surface of a photodiode. The air gap reflection structures may reflect photons upward toward the photodiode so that the photons may be absorbed by the photodiode. This may increase the quantity of photons absorbed by the photodiode, which may increase the quantum efficiency of the pixel sensor and the pixel array.

20 Claims, 28 Drawing Sheets

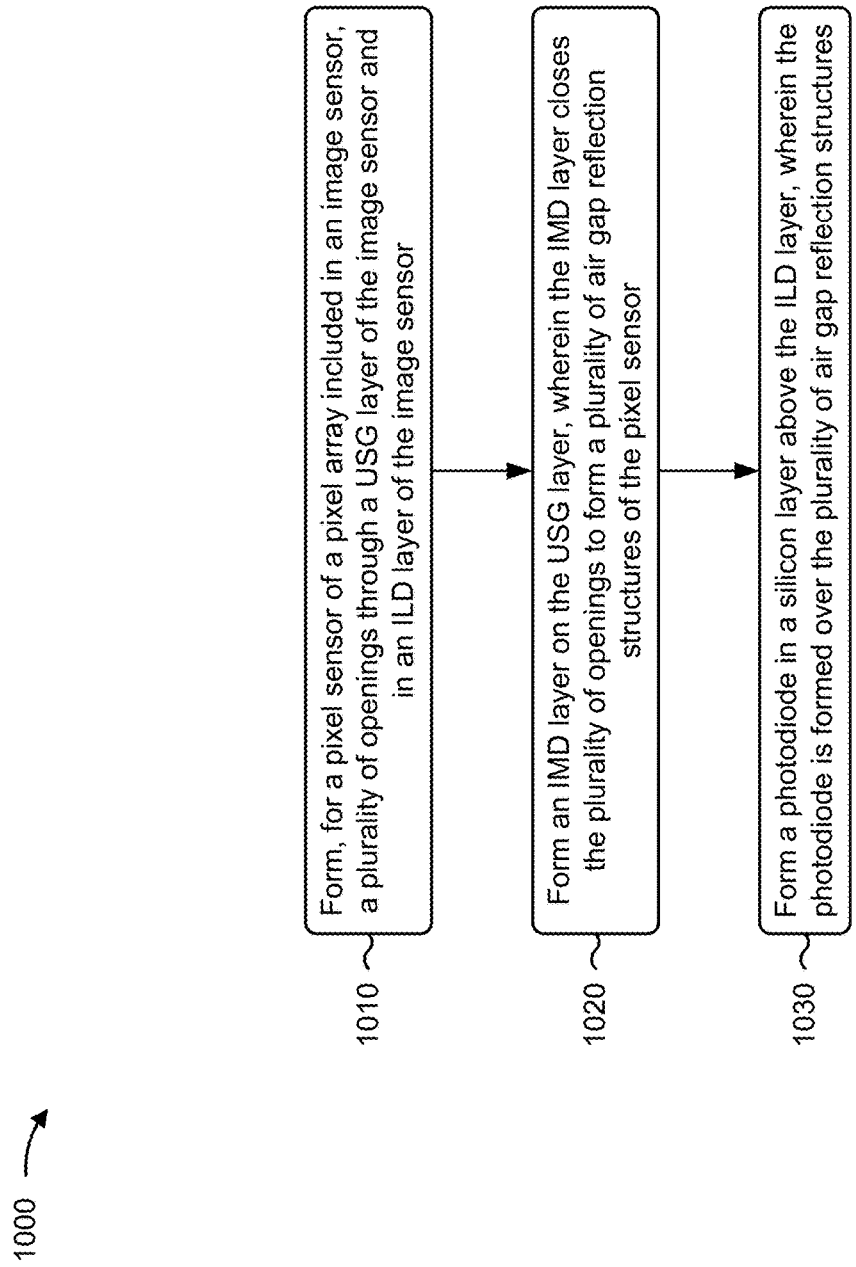

PIXEL ARRAY INCLUDING AIR GAP REFLECTION STRUCTURES

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates readout of the measurements. One type of image sensor commonly used in optical imaging devices is a back side illumination (BSI) image sensor. BSI image sensor fabrication can be integrated into semiconductor processes for low cost, small size, and high integration. Further, BSI image sensors may have low operating voltage, low power consumption, high quantum efficiency, low read-out noise, and may allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a flowchart of an example process relating to forming an image sensor described herein.

DETAILED DESCRIPTION

Figure 1:
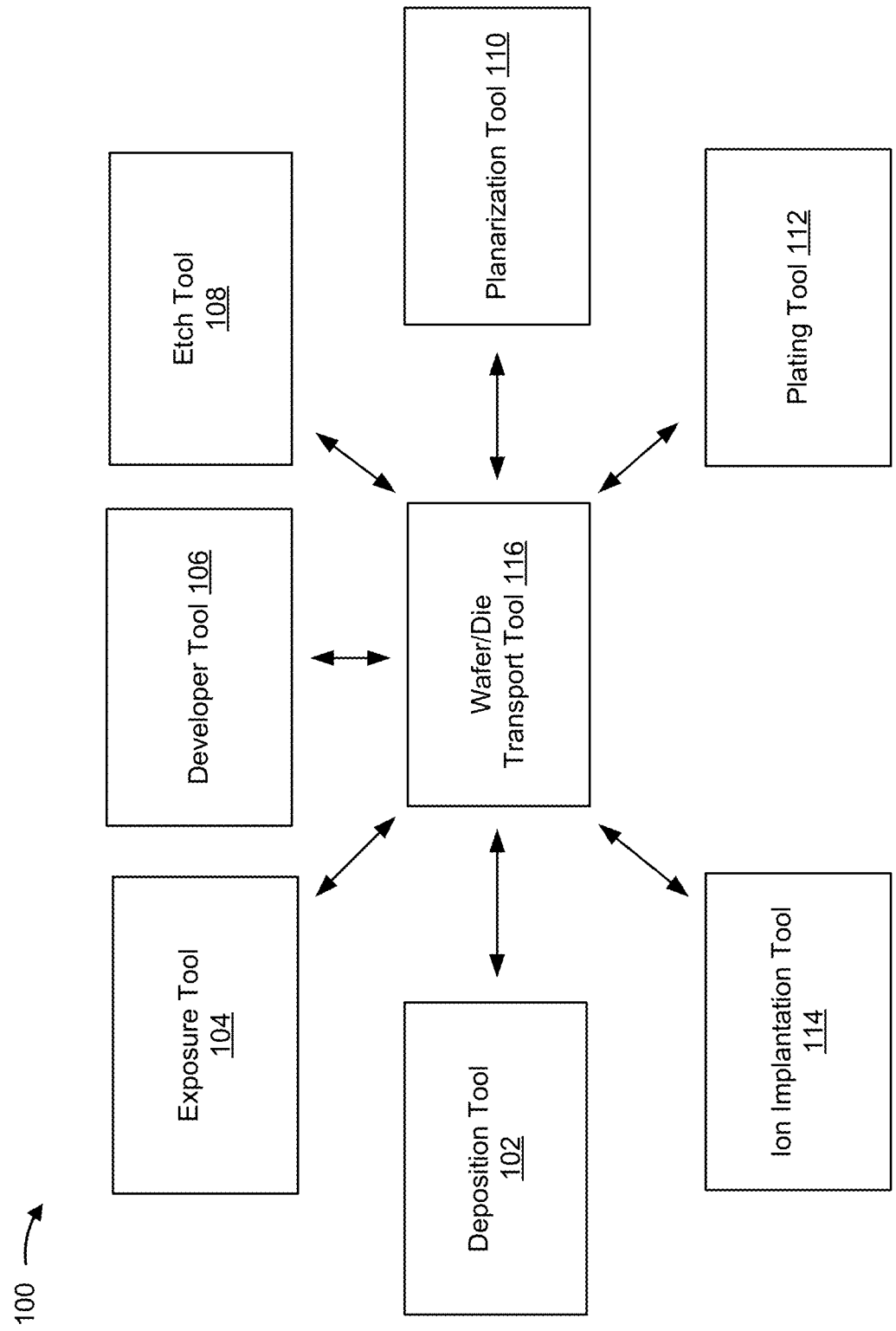
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "over," "under," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some techniques may be used to increase the quantum efficiency of a pixel sensor. The quantum efficiency of a pixel sensor may be determined as a ratio of the number of photons of incident light collected by the pixel to the number of total photons of incident light directed toward the pixel sensor. One example technique includes forming isolation structures on each side of the photodiode associated with the pixel sensor to reduce optical crosstalk between adjacent pixel sensors. The isolation structures may reduce or prevent photons from diffusing into adjacent photodiodes. However, some photons may still at least partially refract, diffuse, or scatter through a bottom surface of a photodiode in a pixel sensor to the layers beneath the pixel sensor, which can cause reduce the quantum efficiency of the pixel sensor.

Some implementations described herein provide techniques and apparatuses for a pixel array that includes air gap reflection structures under a photodiode of a pixel sensor to reflect photons that would otherwise partially refract, diffuse, or scatter through a bottom surface of a photodiode. In this way, the air gap reflection structures reflect photons upward toward the photodiode so that the photons may be absorbed by the photodiode. This may increase the quantity of photons absorbed by the photodiode, which may increase the quantum efficiency of the pixel sensor and the pixel array and/or may decrease the resistive-capacitive (RC) delay of the pixel sensor.

The air gap reflection structures may include holes or trenches formed in one or more layers below the photodiode. A material (e.g., a dielectric material) may be deposited over the openings of the air gap reflection structures to seal the air gap reflection structures such that the air gap reflection structures are primarily filled with air. Air has the lowest refractive index of all materials and is the closest to the refractive index of a vacuum. The low refractive index of air relative to the refractive index of the material (e.g., silicon) of the substrate layer in which the photodiode is formed lowers the critical angle for a total internal reflection at the boundary between the substrate layer material and the air gaps. Photons traveling through the photodiode toward the boundary between the substrate layer material and the air gap at an angle that is equal to or greater than the critical angle may totally reflect off of the substrate layer material-air gap boundary, which causes the photons to be redirected toward and to remain in the photodiode. Thus, the lower critical angle increases the likelihood that a total internal reflection of incident light will occur in the photodiode, which further increases the quantum efficiency of the pixel sensor and the pixel array.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
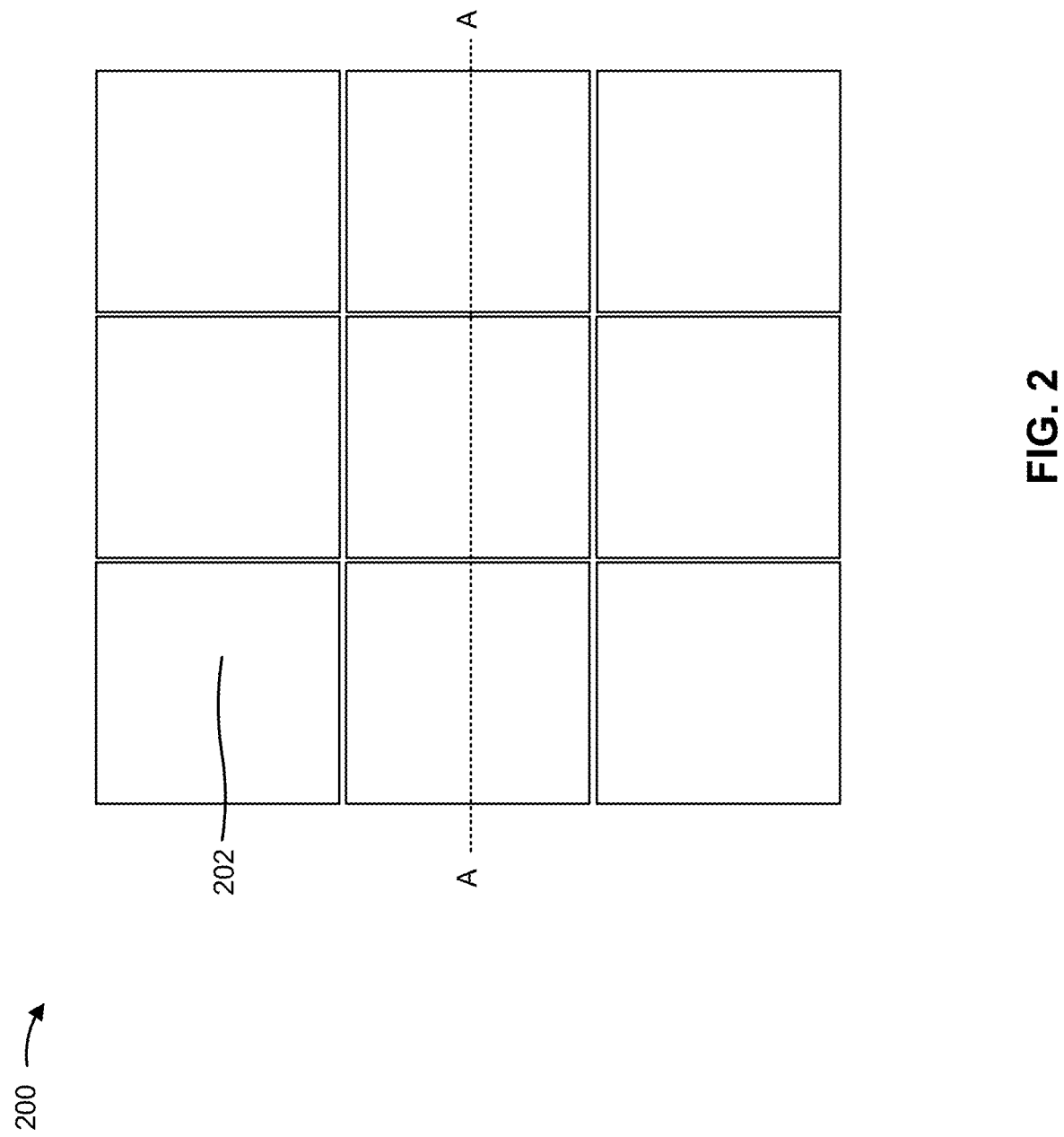
FIG. 2 is a diagram of an example pixel array described herein.

FIG. 2 is a diagram of an example pixel array 200 (or a portion thereof) described herein. The pixel array 200 may be included in an image sensor, such as a complementary metal oxide semiconductor (CMOS) image sensor, a back side illuminated (BSI) CMOS image sensor, or another type of image sensor.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3:
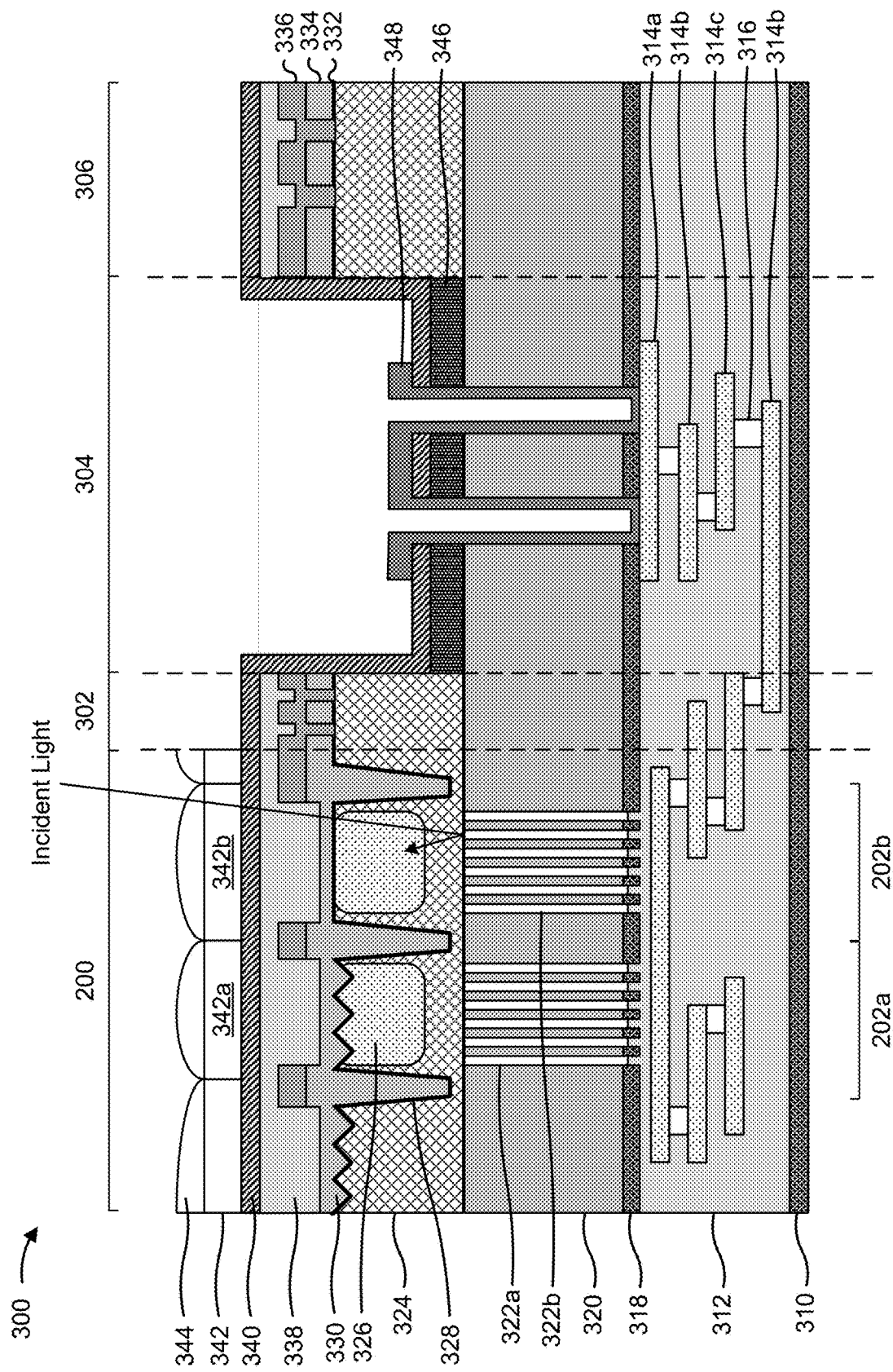
FIG. 3 is a diagram of example image sensor described herein.

FIG. 3 is a diagram of an example image sensor 300 (or a portion thereof) described herein. As shown in FIG. 3, the image sensor 300 may include the pixel array 200. FIG. 3 illustrates a cross-sectional view of the image sensor 300, which includes a cross-sectional view of the pixel array 200 along line AA of FIG. 2. The image sensor 300 may include a CMOS image sensor, a BSI CMOS image sensor, or another type of image sensor. The image sensor 300 may be configured to be deployed in various implementations, such as digital cameras, video recorders, night-vision cameras, automotive sensors and cameras, and/or other types of light-sensing implementations.

As shown in FIG. 3, the image sensor 300 may include a plurality of regions, such as the pixel array 200, a metal shield region 302, a bonding pad region 304 (which may also be referred to as an E-pad region), and a scribe line region 306. The pixel array 200 may include the pixel sensors 202 of the image sensor 300, such as pixel sensor 202a and pixel sensor 202b. In some implementations, the image sensor 300 includes a greater quantity of pixel sensors 202 or fewer pixel sensors 202 than the quantity of pixel sensors illustrated in FIG. 3.

The metal shield region 302 may include one or more devices that are maintained in an optically dark environment. For example, the metal shield region 302 may include a reference pixel that is used to establish a baseline of an intensity of light for the image sensor 300. In some implementations, the metal shield region 302 includes periphery devices, such as one or more application-specific integrated circuit (ASIC) devices, one or more system-on-chip (SOC) devices, one or more transistors, and/or one or more other components configured to measure the amount of charge stored by the pixel sensors 202 to determine light intensity of incident light and/or to generate images and/or video (e.g., digital images, digital video).

The bonding pad region 304 may include one or more conductive bonding pads (or e-pads) and/or metallization layers through which electrical connections between the image sensor 300 and outside devices and/or external packaging may be established. The scribe line region 306 may include a region that separates one semiconductor die or portion of a semiconductor die that includes the image sensor 300 from an adjacent semiconductor die or portion of the semiconductor die that includes other image sensors and/or other integrated circuits.

As further shown in FIG. 3, the image sensor 300 may include various layers and/or structures. In some implementations, the image sensor 300 may be mounted and/or fabricated on a carrier substrate (not shown) during one or more semiconductor processing operations to form the image sensor 300. As shown in FIG. 3, the image sensor 300 may include a buffer layer 310. The buffer layer 310 may include a dielectric material such as a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material. The buffer layer 310 may serve as a layer by which the image sensor 300 is bonded to the carrier substrate so that back side processing may be performed on the image sensor 300.

As further shown in FIG. 3, the image sensor 300 may include an inter-metal dielectric (IMD) layer 312 above and/or on the buffer layer 310. The IMD layer 312 may include one or more layers of dielectric material (e.g., a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material). Various metallization layers 314 may be formed in and/or in between the layers of the IMD layer 312. The metallization layers 314 may include bonding pads, conductive lines, and/or other types of conductive structures that electrically connect the various regions of the image sensor 300 and/or electrically connect the various regions of the image sensor 300 to one or more external devices and/or external packaging. The metallization layers 314 may be interconnected by contacts 316, which may also be referred to as vias. For example, a metallization layer 314a may be electrically connected to a metallization layer 314b by one or more contacts 316, the metallization layer 314b may be electrically connected to a metallization layer 314c by one or more contacts 316, the metallization layer 314c may be electrically connected to a metallization layer 314d by one or more contacts 316, and so on. The metallization layers 314 and the contacts 316 may be referred to as a BEOL metallization stack, and may include a conductive material, such as gold, copper, silver, cobalt, tungsten, a metal alloy, or a combination thereof, among other examples.

As further shown in FIG. 3, the image sensor 300 may include an un-doped silicate glass (USG) layer 318 above and/or on the IMD layer 312. The USG layer 318 may function as an insulator and a passivation layer between the IMD layer 312 and an interlayer dielectric (ILD) layer 320 above the IMD layer 312. The ILD layer 320 may include a dielectric material (e.g., a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material).

As further shown in FIG. 3, one or more air gap reflection structures 322 may be formed and/or located through the USG layer 318 and at least partially in and/or through the ILD layer 320. The air gap reflection structures 322 may be configured to reflect photons of incident light that would otherwise refract, diffuse, and/or scatter through to the ILD layer 320, the USG layer 318, and/or the IMD layer 312. One or more of the pixel sensors 202 may include one or more air gap reflection structures 322. For example, the pixel sensor 202a may include one or more air gap reflection structures 322a, the pixel sensor 202b may include one or more air gap reflection structures 322b, and so on. In some implementations, all of the pixel sensors 202 in the pixel array 200 include air gap reflection structures 322. In some implementations, a subset of the pixel sensors 202 in the pixel array 200 include air gap reflection structures 322.

An air gap reflection structure 322 may include a hole, a trench, or another structure that is substantially filled with air. In some implementations, an air gap reflection structure 322 may be formed through the USG layer 318 and through the ILD layer 320 to a substrate layer 324 of the image sensor 300. In this way, an interface between the air gap reflection structure 322 and the substrate layer 324 is formed. Air has the lowest refractive index of all materials and is the closest to the refractive index of a vacuum. The low refractive index of air relative to the refractive index of the material of the substrate layer 324 lowers the critical angle for a total internal reflection at the interface between an air gap reflection structure 322 and the material of the substrate layer 324. Thus, as shown in FIG. 3, incident light traveling through the substrate layer 324 toward the interface between an air gap reflection structure 322 and the substrate layer 324 at an angle that is equal to or greater than the critical angle may be totally reflected off of the interface and upward toward a photodiode 326 of a pixel sensor 202. Thus, the lower critical angle increases the likelihood that a total internal reflection of incident light will occur at the interface between an air gap reflection structure 322 and the substrate layer 324, which will cause the incident light to reflect off of the interface and be absorbed by a photodiode of a pixel sensor 202 as opposed (or in addition) to the incident light being partially refracted, diffused, or scattered to the ILD layer 320, the USG layer 318, and/or the IMD layer 312.

The substrate layer 324 may be referred to as a device substrate on which back side processing of the image sensor 300 is performed. The substrate layer 324 may include a silicon layer, a layer formed of a material including silicon, a III-V compound semiconductor layer such as gallium arsenide (GaAs) layer, a silicon on insulator (SOI) layer, or another type of substrate that is capable of generating a charge from photons of incident light.

Photodiodes 326 for the pixel sensors 202 in the pixel array 200 may be formed in the substrate layer 324. A photodiode 326 may include a region of the substrate layer 324 that is doped with a plurality of types of ions to form a p-n junction or a PIN junction (e.g., a junction between a p-type portion, an intrinsic (or undoped) type portion, and an n-type portion). For example, the substrate layer 324 may be doped with an n-type dopant to form a first portion (e.g., an n-type portion) of a photodiode 326 and a p-type dopant to form a second portion (e.g., a p-type portion) of the photodiode 326. A photodiode 326 may be configured to absorb photons of incident light. The absorption of photons causes a photodiode 326 to accumulate a charge (referred to as a photocurrent) due to the photoelectric effect. Here, photons bombard the photodiode 326, which causes emission of electrons of the photodiode 326. The emission of electrons causes the formation of electron-hole pairs, where the electrons migrate toward the cathode of the photodiode 326 and the holes migrate toward the anode, which produces the photocurrent.

In some implementations, respective pluralities of air gap reflection structures 322 may be formed and/or located below and/or under the photodiodes 326 of one or more pixel sensors 202. For example, a plurality of air gap reflection structures 322a may be formed through and/or located in the USG layer 318 and the ILD layer 320 below and/or under the photodiode 326 of the pixel sensor 202a, a plurality of air gap reflection structures 322b may be formed through and/or located in the USG layer 318 and the ILD layer 320 below and/or under the photodiode 326 of the pixel sensor 202b, and so on. In this way, the quantum efficiency of the one or more pixel sensors 202 may be increased as a result of the reflected photons of incident light by the respective plurality of air gap reflection structures 322.

A plurality of deep trench isolation (DTI) structures 328 may be included in the substrate layer 324. In particular, DTI structures 328 may be formed between each of the photodiodes 326 of the pixel sensors 202 such that the photodiodes 326 are surrounded by DTI structures 328. As an example, a DTI structure 328 may be formed between the photodiode 326 of the pixel sensor 202a and the pixel sensor 202b, a DTI structure 328 may be formed between the photodiode 326 of the pixel sensor 202a and an adjacent pixel sensor, a DTI structure 328 may be formed between the photodiode 326 of the pixel sensor 202b and an adjacent pixel sensor, and so on. The DTI structures 328 may form a grid layout in which DTI structures 328 extend laterally across the pixel array 200 and intersect at various locations of the pixel array 200. In some implementations, the DTI structure 328 may be backside DTI (BDTI) structures formed as a part of back side processing of the image sensor 300.

The DTI structures 328 may include trenches (e.g., deep trenches) that extend downward into the substrate layer 324 along the photodiodes 326. The DTI structures 328 may provide optical isolation between the pixel sensors 202 of the pixel array 200 to reduce the amount of optical crosstalk between adjacent pixel sensors 202. In particular, DTI structures 328 may absorb, refract, and/or reflect incident light, which may reduce the amount of incident light that travels through a pixel sensor 202 into an adjacent pixel sensor 202 and is absorbed by the adjacent pixel sensor 202.

One or more high absorption regions 330 may be located in the substrate layer 324, and in and/or above one or more photodiodes 326. Each high absorption region 330 may be defined by a shallow trench. A plurality of adjacent high absorption regions 330 may form a periodic or zig-zag structure in the substrate layer 324 and/or the photodiode(s) 326. The one or more high absorption regions 330 may be formed in a same side of the substrate layer 324 as the DTI structures 328.

A high absorption region 330 may increase the absorption of incident light for a pixel sensor 202 (thereby increasing the quantum efficiency of the pixel sensor 202) by modifying or changing the orientation of the refractive interface between the photodiode 326 of the pixel sensor 202 and the substrate layer 324. The angled walls of the high absorption region 330 change the orientation of the interface between the photodiode 326 and the substrate layer 324 by causing the interface to be diagonal relative to the orientation of a top surface of the substrate layer 324. This change in orientation may result in a smaller angle of refraction relative to a flat surface of the top surface of the substrate layer 324 for the same angle of incidence of incident light. As a result, the high absorption region 330 is capable of directing wider angles of incident light toward the center of the photodiode 326 of the pixel sensor 202 than if no high absorption region 330 were included in the pixel sensor 202.

The top surface of the substrate layer 324, the surfaces of the DTI structures 328, and the surfaces of the high absorption region(s) 330 may be coated with an antireflective coating (ARC) layer 332 to decrease reflection of incident light away from the photodiodes 326 and to increase transmission of incident light into the substrate layer 324 and the photodiodes 326. The ARC layer 332 may include a suitable material for reducing a reflection of incident light projected toward the photodiodes 326, such as a nitrogen-containing material or other examples.

An oxide layer 334 may be located above the substrate layer 324 and above and/or on the ARC layer 332. Moreover, the material of the oxide layer 334 may fill the DTI structures 328 and the high absorption region(s) 330. The oxide layer 334 may function as a passivation layer between the substrate layer 324 and the upper layers of the pixel array 200. In some implementations, the oxide layer 334 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the oxide layer 334 as a passivation layer.

A metal shielding layer 336 may be located above and/or on the oxide layer 334 (or portions thereof). The metal shielding layer 336 may provide shielding for the components and/or devices formed in the metal shield region 302. The metal shielding layer 336 may be formed of a metal material, such as gold, silver, aluminum, a metal alloy, or a similar metal. One or more passivation layers may be formed above and/or on the metal shielding layer 336. For example, a BSI oxide layer 338 may be located above and/or on portions of the oxide layer 334, and above and/or on the metal shielding layer 336. As another example, a buffer oxide layer 340 may be located above and/or on the BSI oxide layer 338. In some implementations, the BSI oxide layer 338 and/or the buffer oxide layer 340 include an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the BSI oxide layer 338 and/or the buffer oxide layer 340 as a passivation layer.

A filter layer 342 may be included above and/or on the buffer oxide layer 340 for one or more pixel sensors 202 in the pixel array 200. The filter layer 342 may include one or more visible light color filter regions configured to filter particular wavelengths or wavelength ranges of visible light (e.g., that permit particular wavelengths or wavelength ranges of visible light to pass through the filter layer 342), one or more near infrared (NIR) filter regions (e.g., NIR bandpass filter regions) configured to permit wavelengths associated with NIR light to pass through the filter layer 342 and to block other wavelengths of light, one or more NIR cut filter regions configured to block NIR light from passing through the filter layer 342, and/or other types of filter regions. In some implementations, one or more pixel sensors 202 in the pixel array 200 are each configured with a filter region of the filter layer 342. For example, the pixel sensor 202a may be configured with a filter region 342a above the photodiode 326 of the pixel sensor 202a, the pixel sensor 202b may be configured with a filter region 342b above the photodiode 326 of the pixel sensor 202b, and so on. In some implementations, filter regions may be omitted from the filter layer 342 for one or more pixel sensors 202 in the pixel array 200 to permit all wavelengths of light to pass through the filter layer 342 for the one or more pixel sensors 202. In these examples, the one or more pixel sensors 202 may be configured as white pixel sensors.

A micro-lens layer 344 may be included above and/or on the filter layer 342. The micro-lens layer 344 may include a plurality of micro-lenses. In particular, the micro-lens layer 344 may include a respective micro-lens for each of the pixel sensors 202 included in the pixel array 200. For example, a first micro-lens may be formed to focus incident light toward the photodiode 326 of pixel sensor 202a, a second micro-lens may be formed to focus incident light toward the photodiode 326 of pixel sensor 202b, and so on.

As shown in the bonding pad region 304 of the image sensor 300, a shallow trench isolation (STI) structure 346 may be located above and/or on the ILD layer 320 in the bonding pad region 304. The STI structure 346 may provide electrical isolation in the bonding pad region 304. For example, the STI structure 346 may electrically isolate the pixel array 200 and/or the metal shield region 302 from other regions of the image sensor 300 and/or from other devices formed on the same semiconductor die as the image sensor 300. In some implementations, the buffer oxide layer 340 may be located above and/or on the STI structure 346 in the bonding pad region 304.

A bonding pad 348 may be located in the bonding pad region 304 above the STI structure 346, and/or above and/or on the buffer oxide layer 340. The bonding pad 348 may extend through the buffer oxide layer 340, through the STI structure 346, and through the ILD layer 320 to the IMD layer 312, and may contact one or more metallization layers 314 in the IMD layer 312. The bonding pad 348 may include a conductive material, such as gold, silver, aluminum, copper, aluminum-copper, titanium, tantalum, titanium nitride, tantalum nitride, tungsten, a metal alloy, other metals, or a combination thereof. The bonding pad 348 may provide electrical connections between the metallization layers 314 of the image sensor 300 and external devices and/or external packaging.

The number and arrangement of components, structures, and/or layers shown in the image sensor 300 of FIG. 3 are provided as an example. In practice, the image sensor 300 may include additional components, structures, and/or layers; fewer components, structures, and/or layers; different components, structures, and/or layers; and/or differently arranged components, structures, and/or layers than those shown in FIG. 3.

Figure 4A:
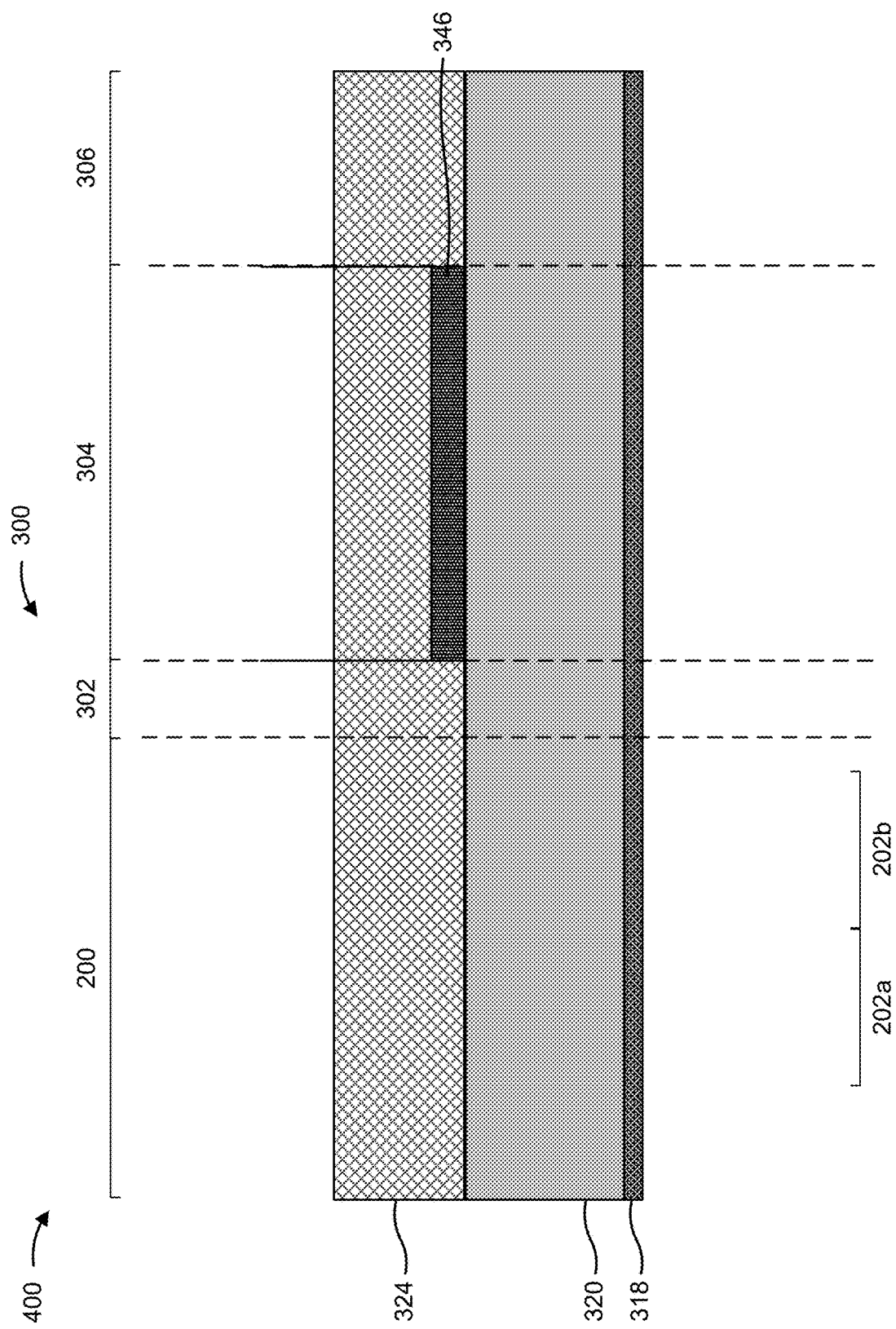
FIGS. 4A-4S are diagrams of an example implementation described herein.
Figure 4B:
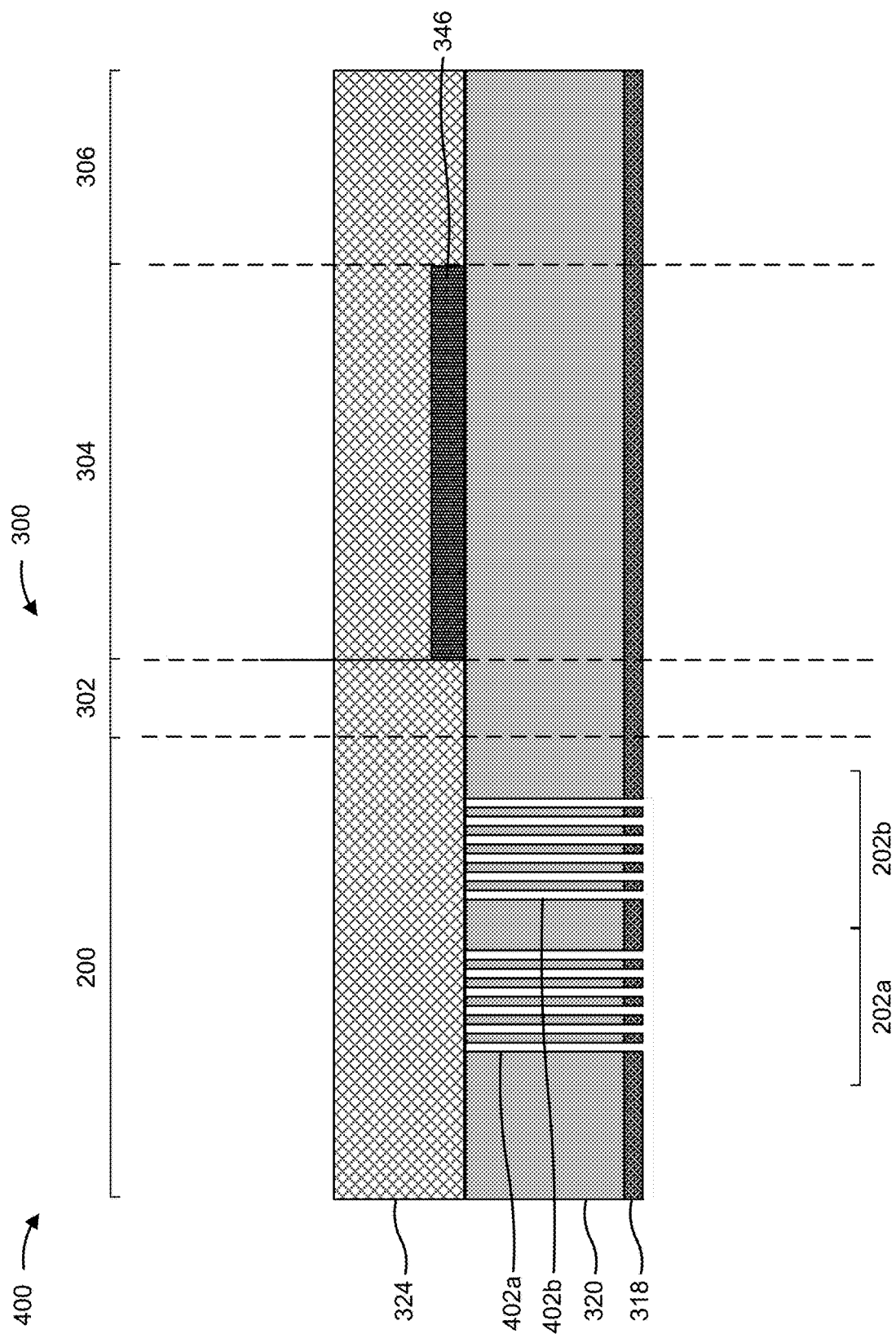
Figure 4C:
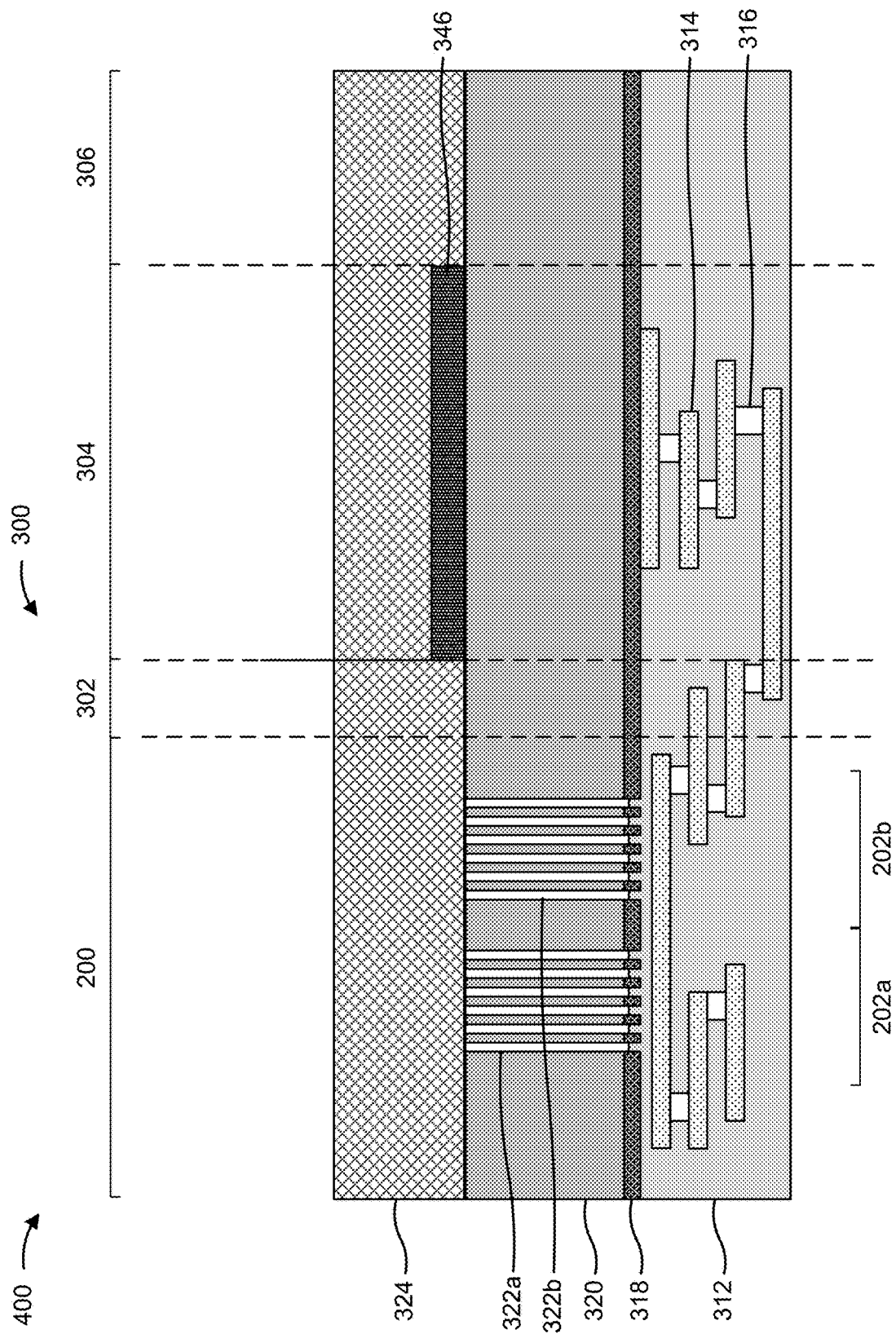
Figure 4D:
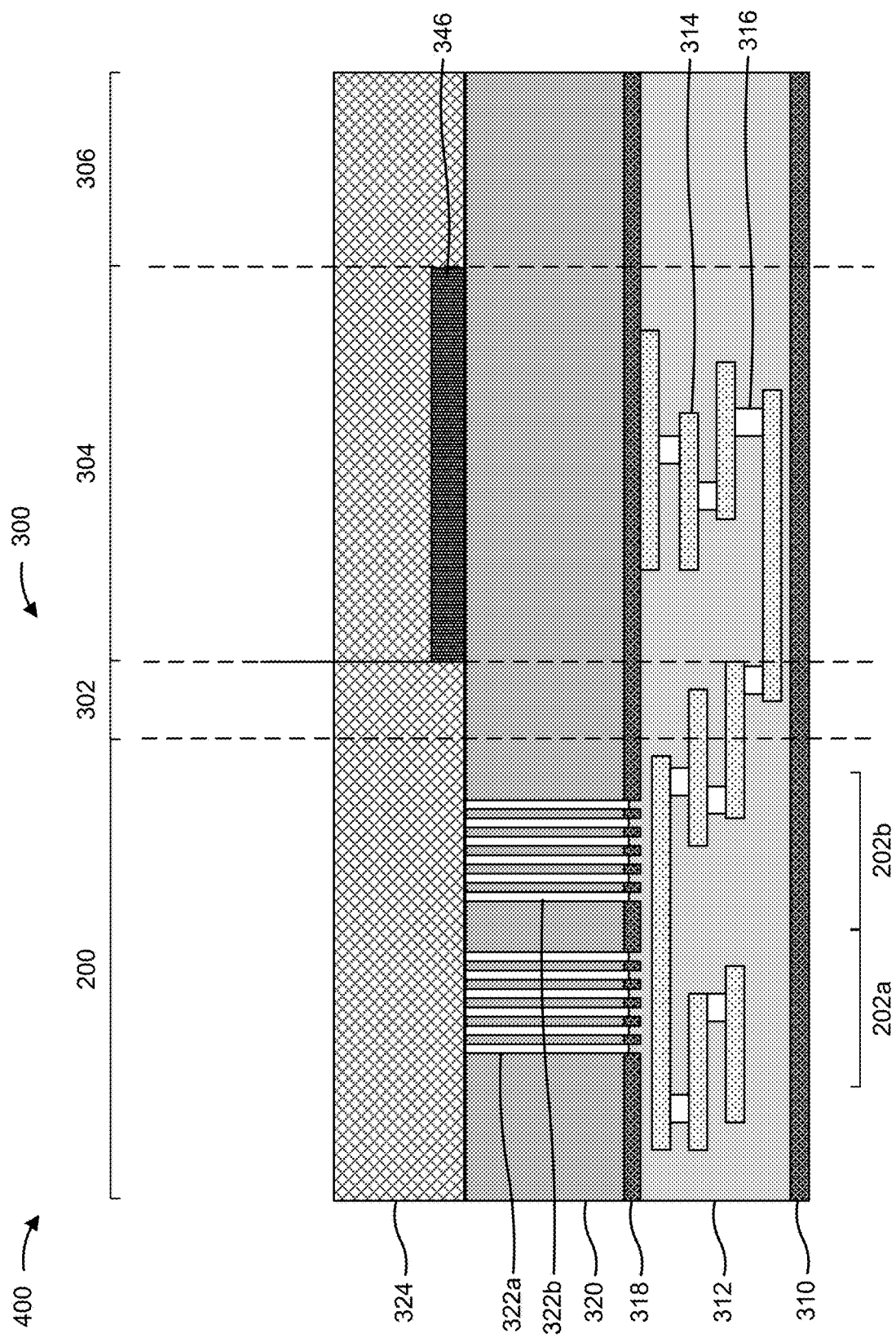
Figure 4E:
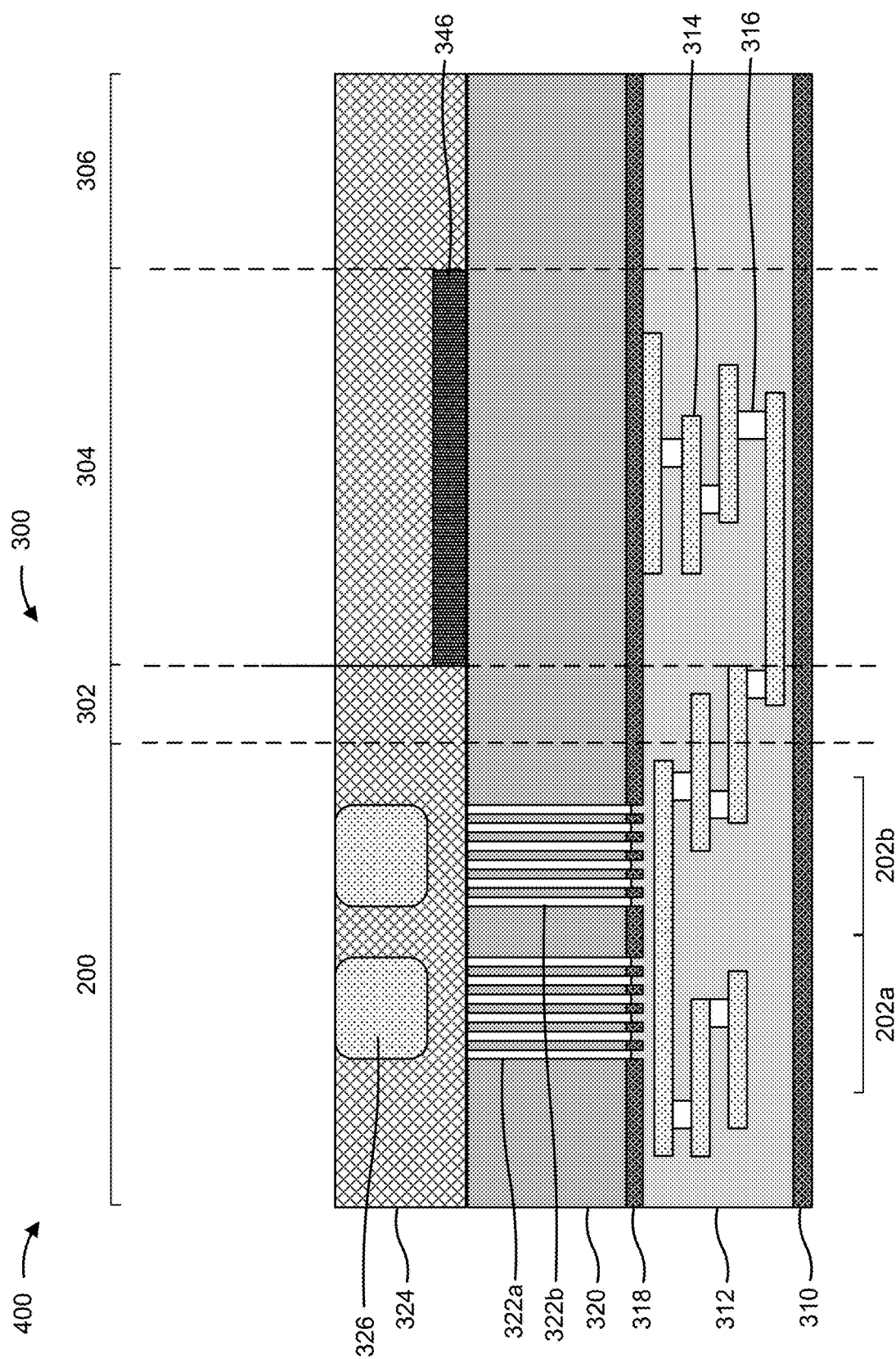
Figure 4F:
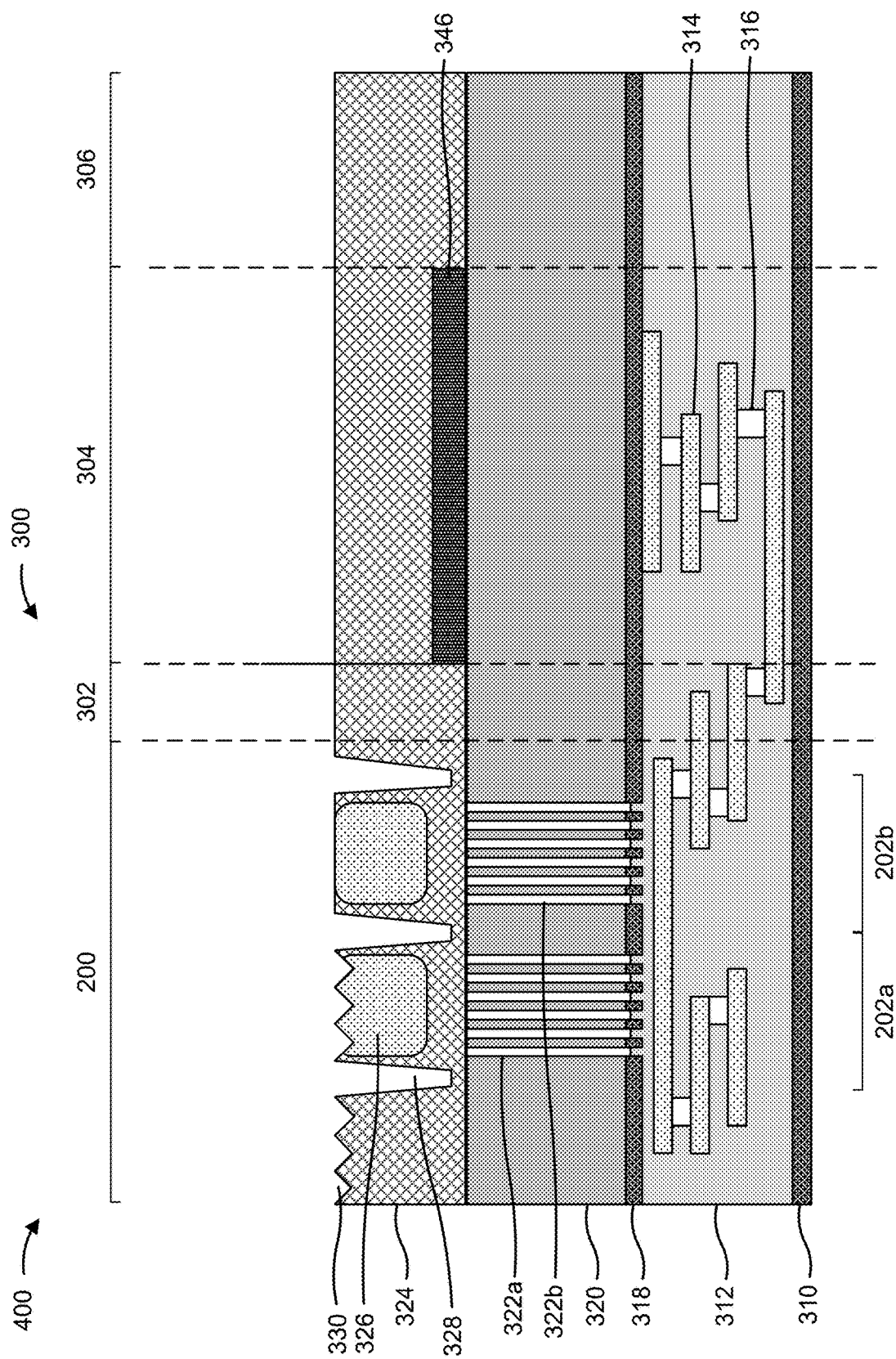
Figure 4G:
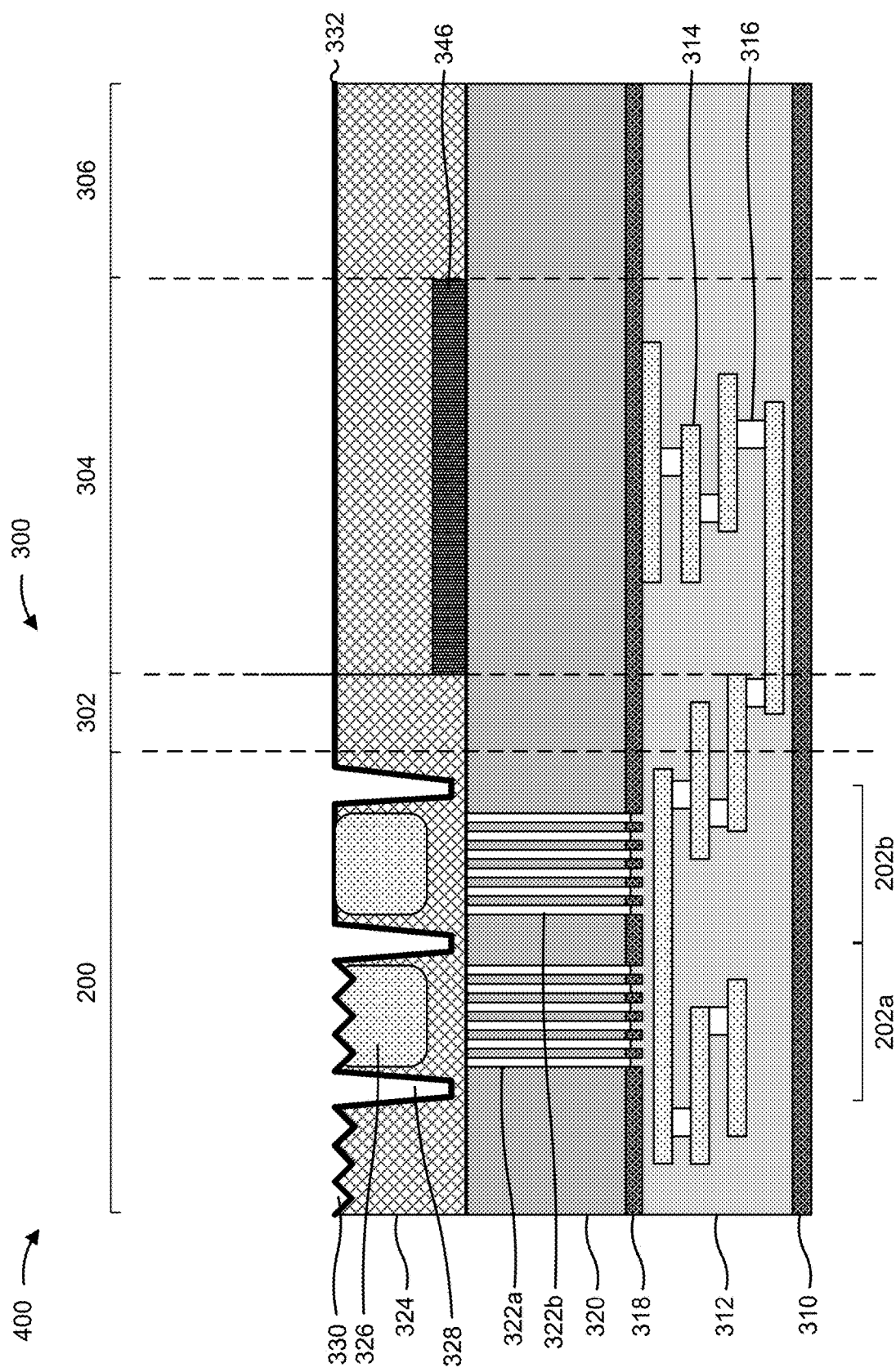
Figure 4H:
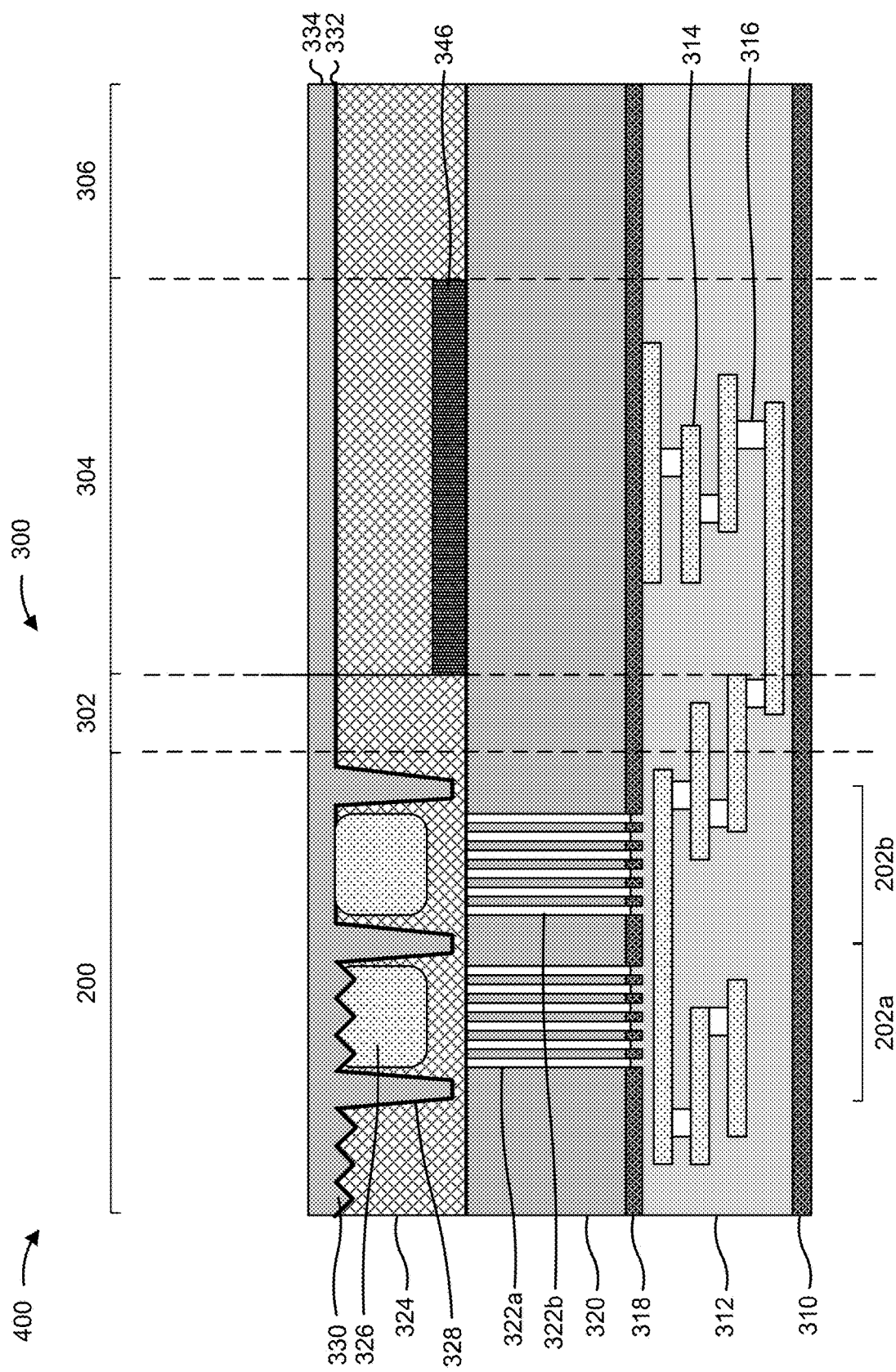
Figure 4I:
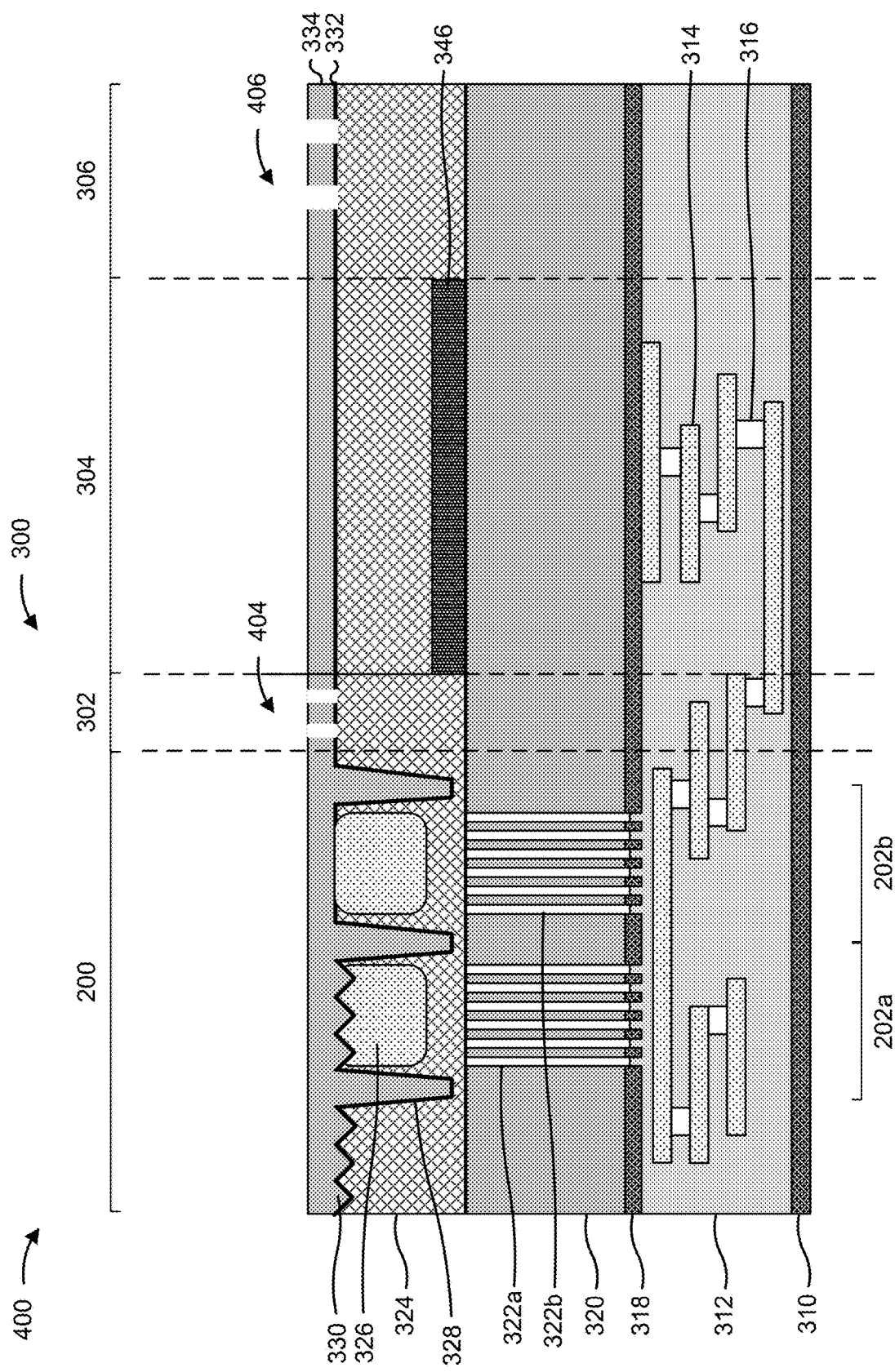
Figure 4J:
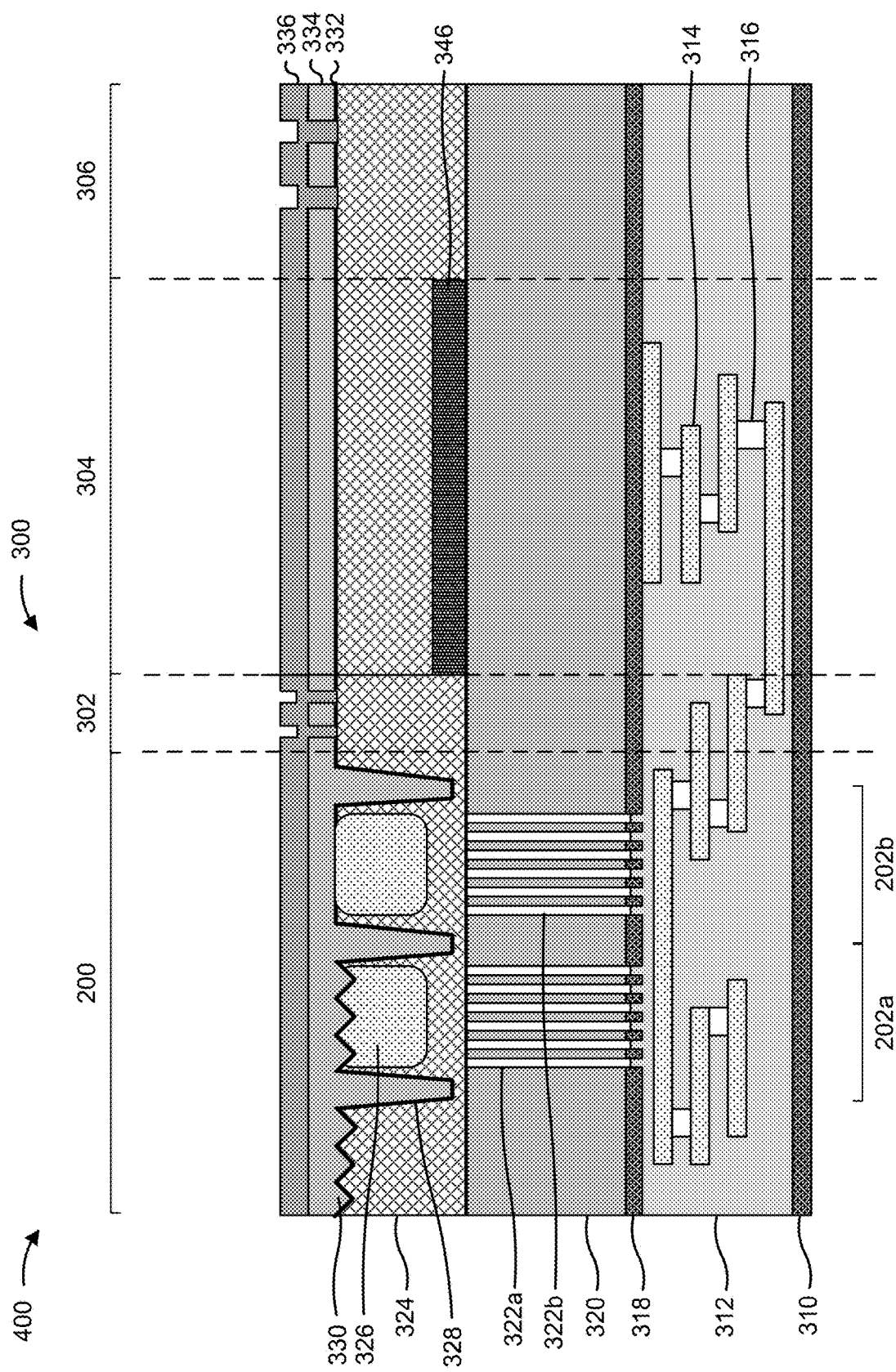
Figure 4K:
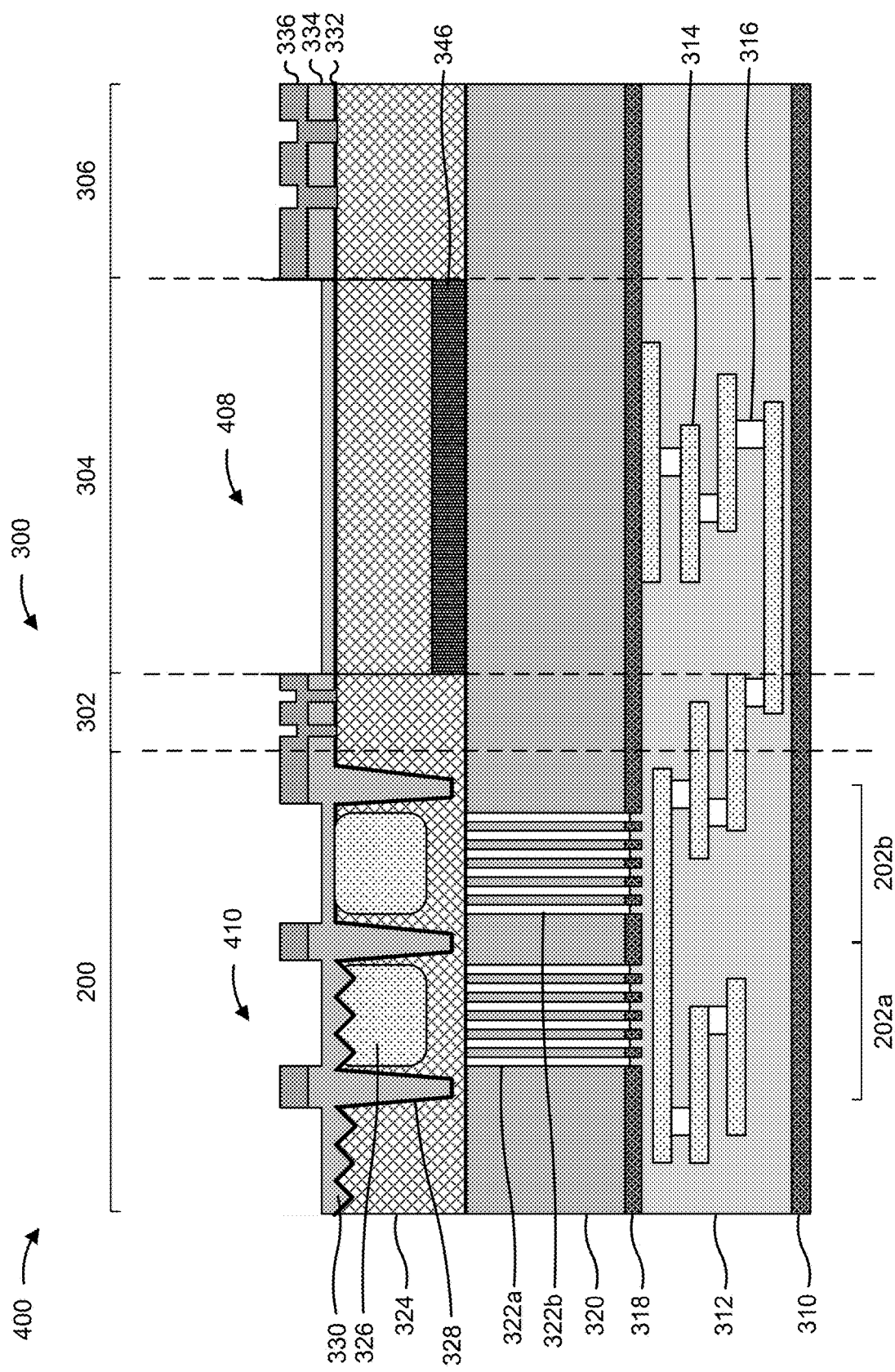
Figure 4L:
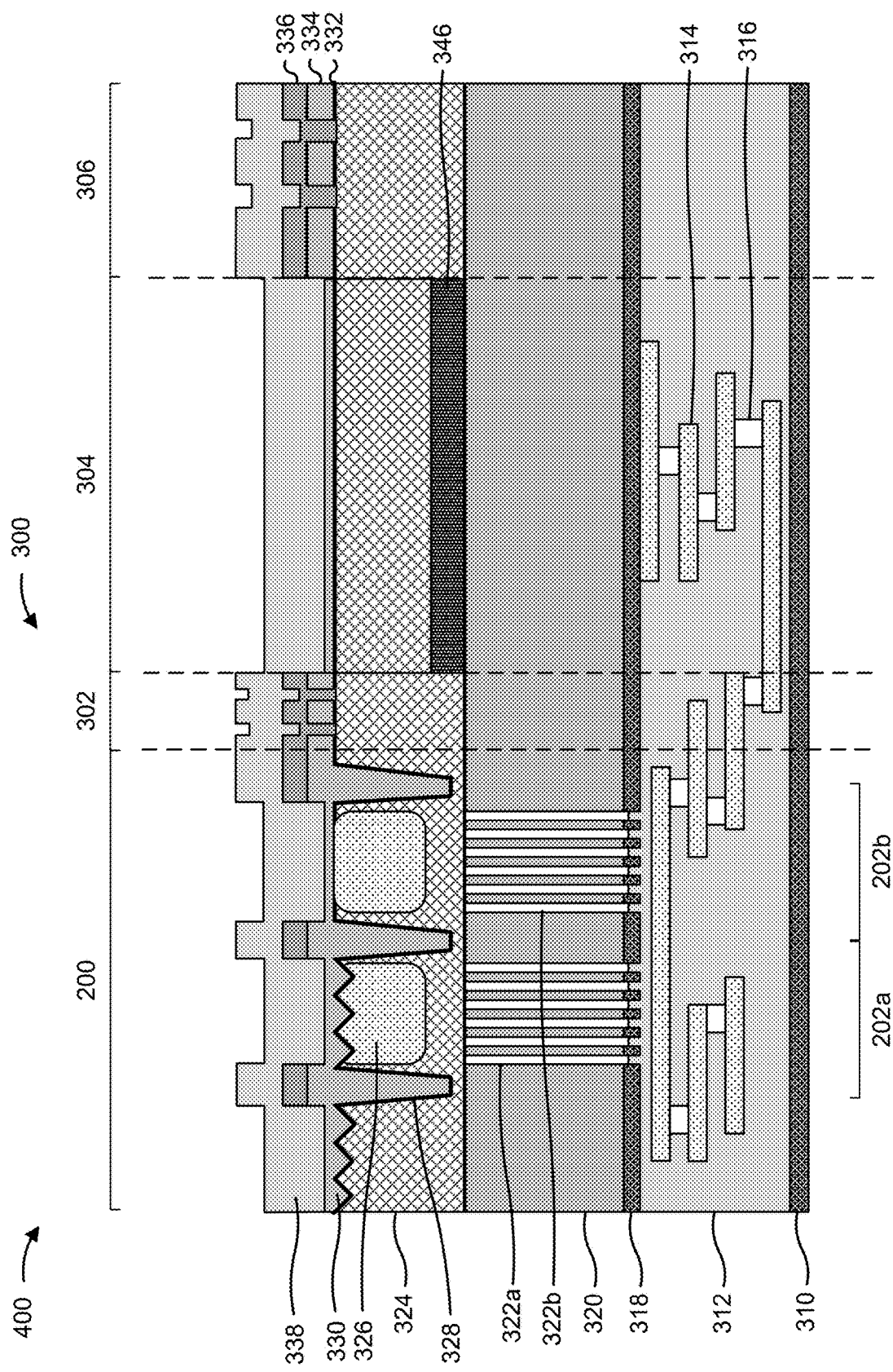
Figure 4M:
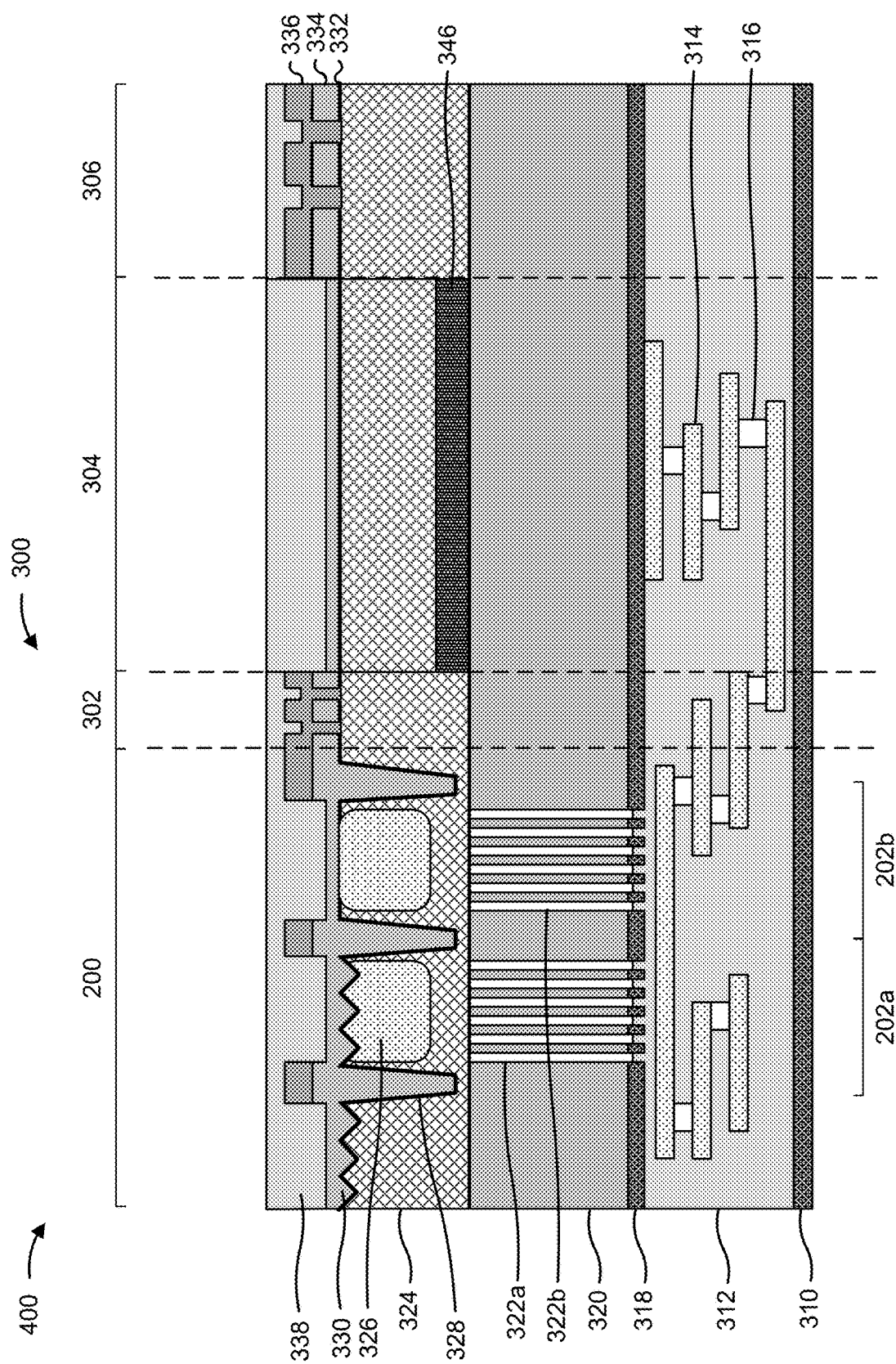
Figure 4N:
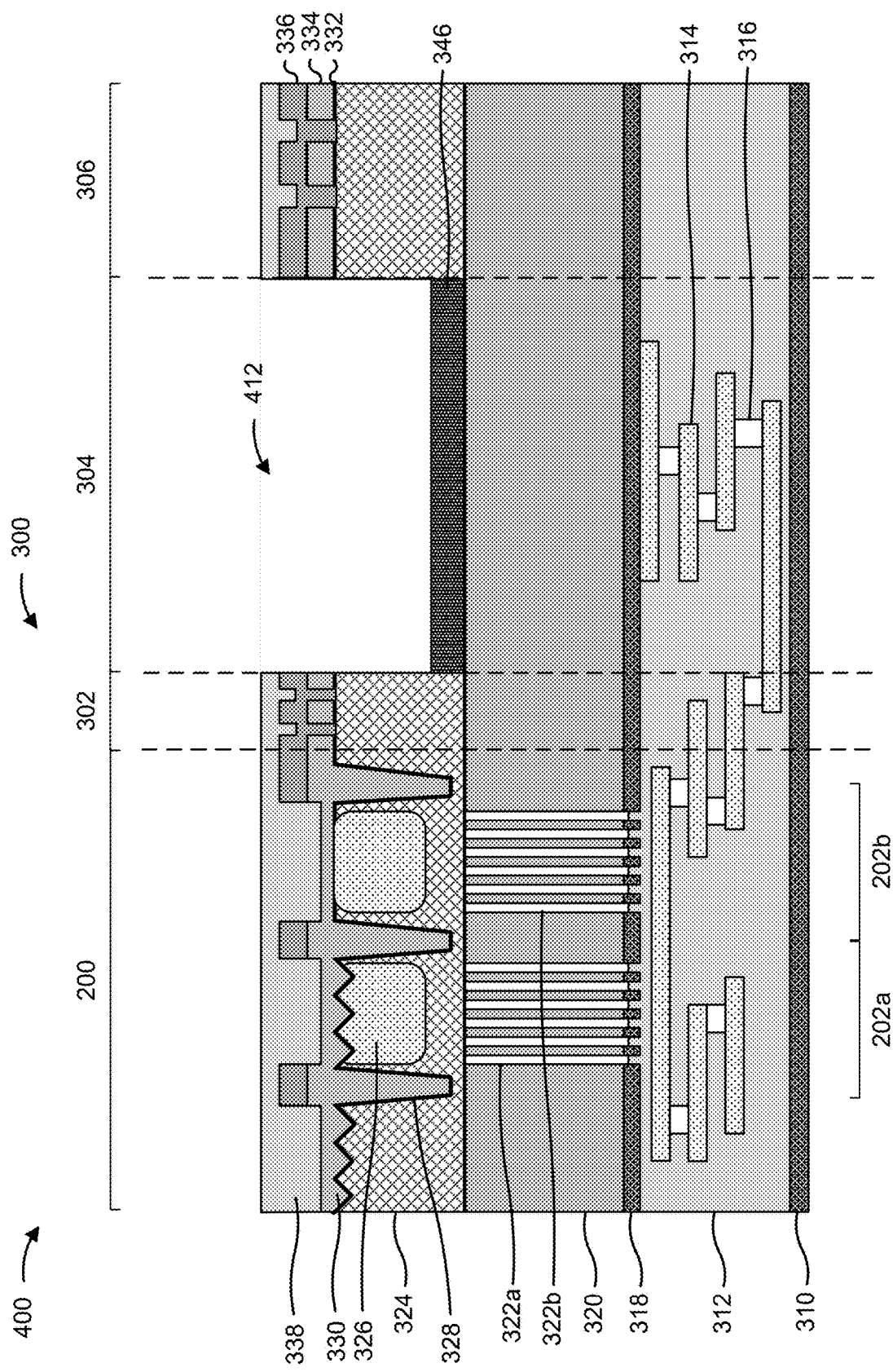
Figure 4O:
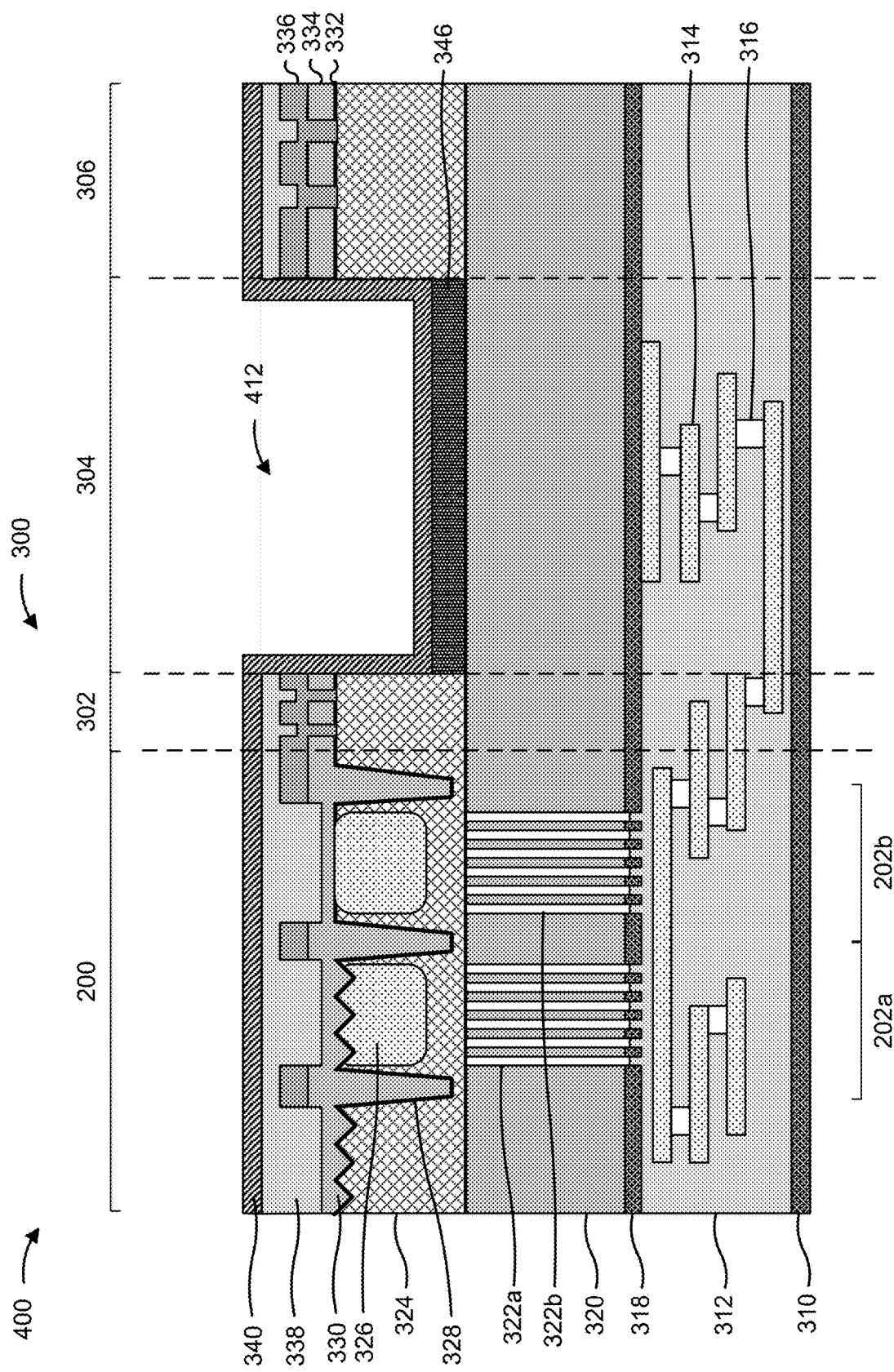
Figure 4P:
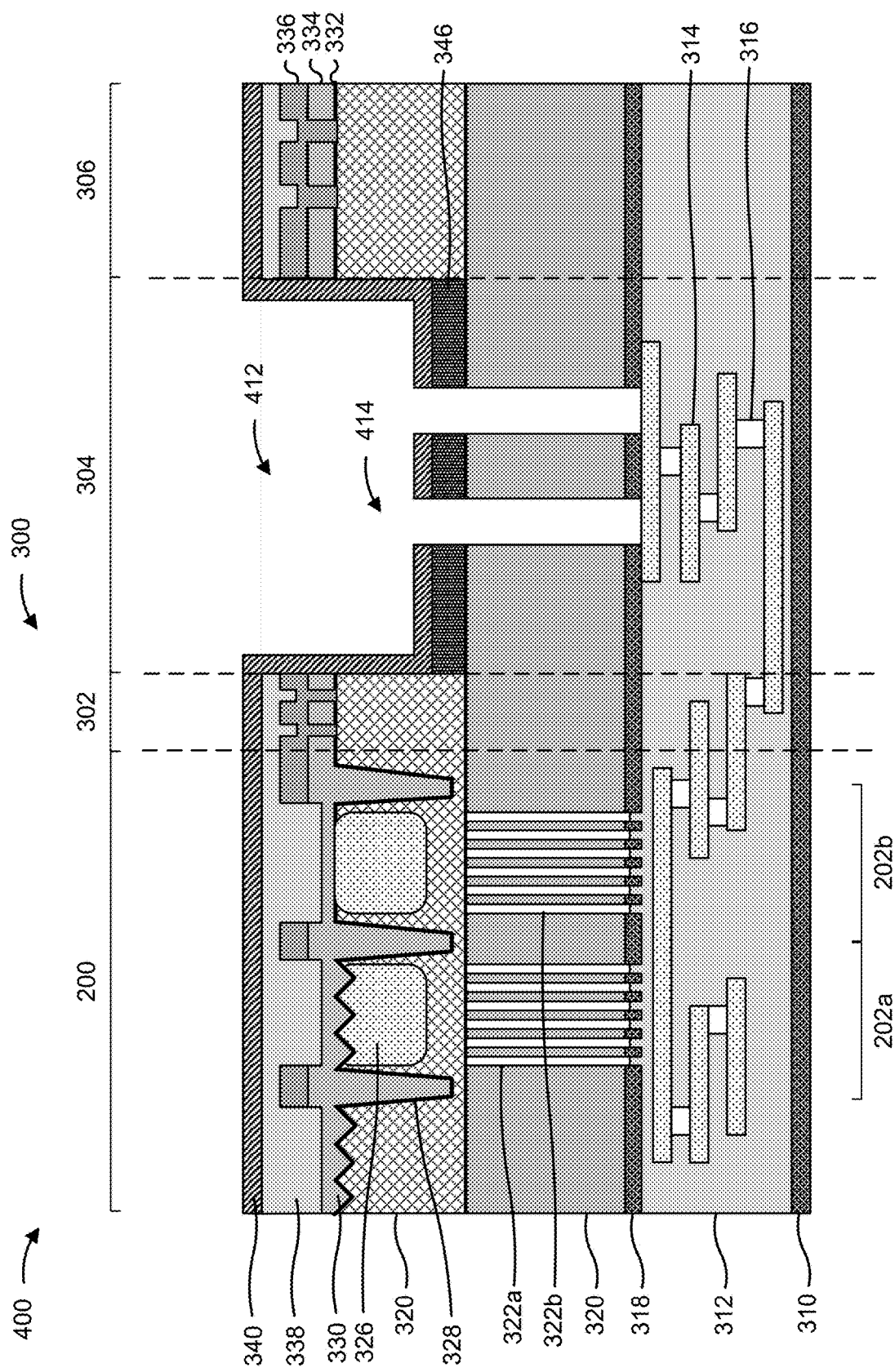
Figure 4Q:
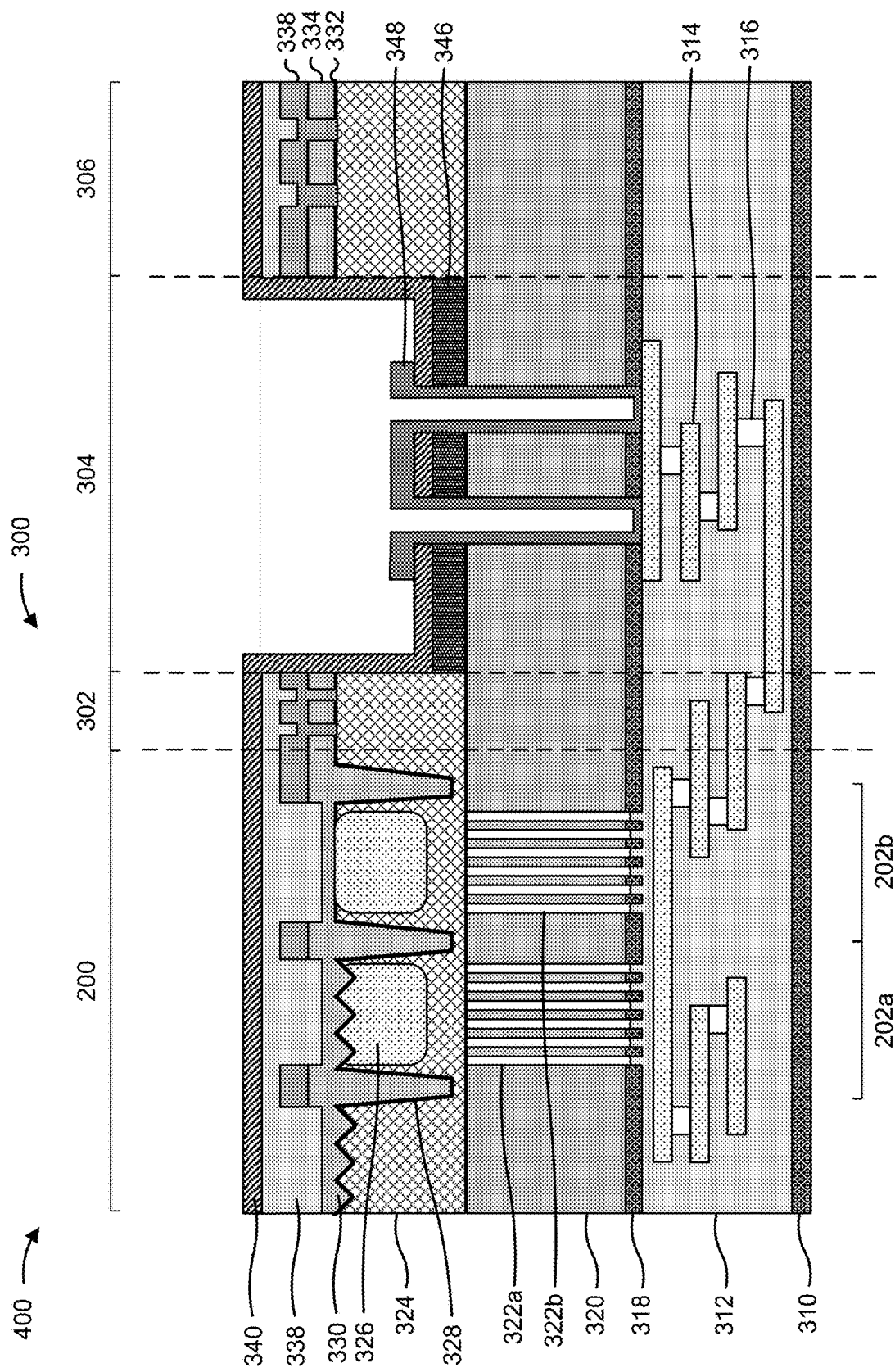
Figure 4R:
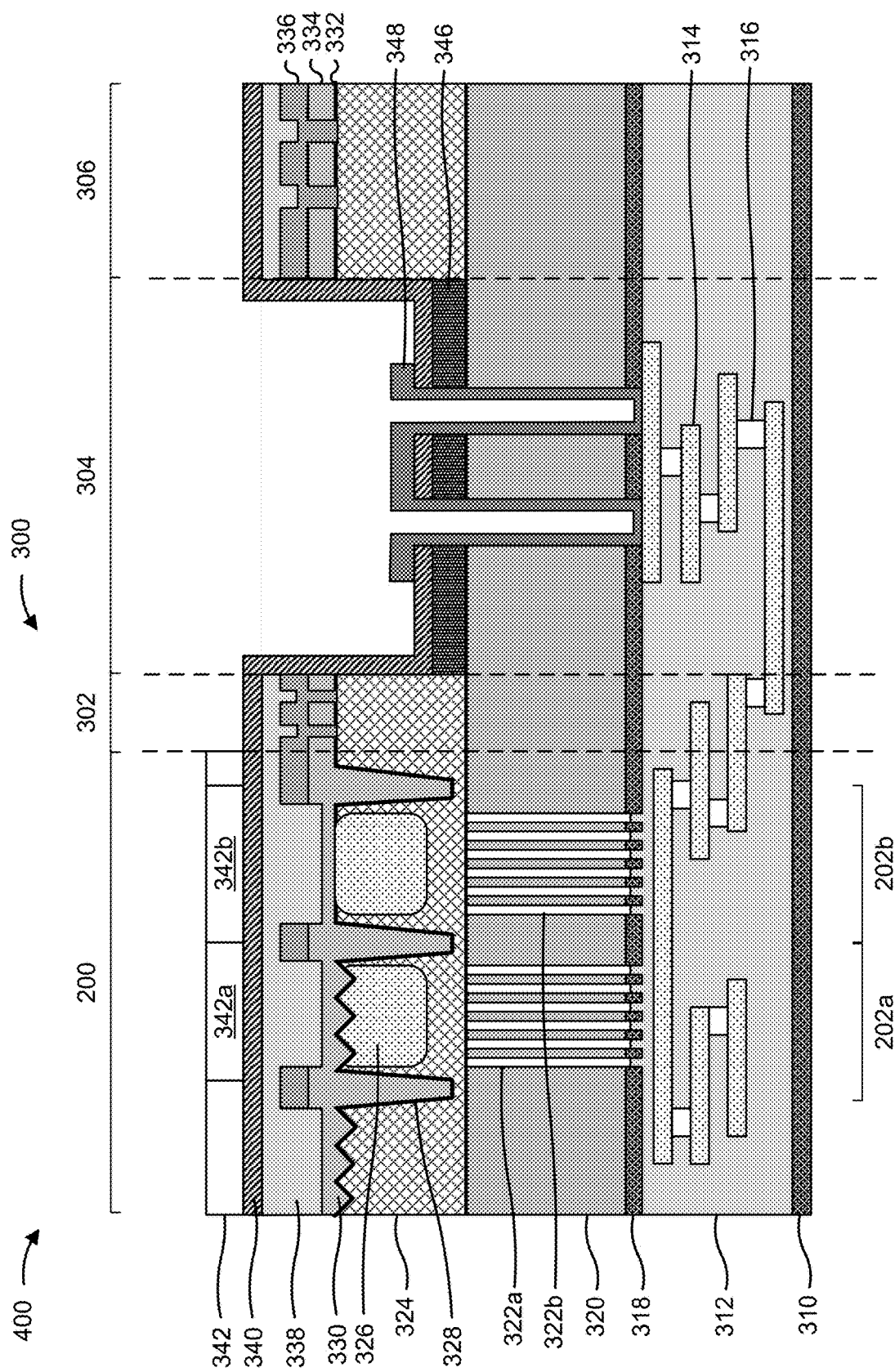
Figure 4S:
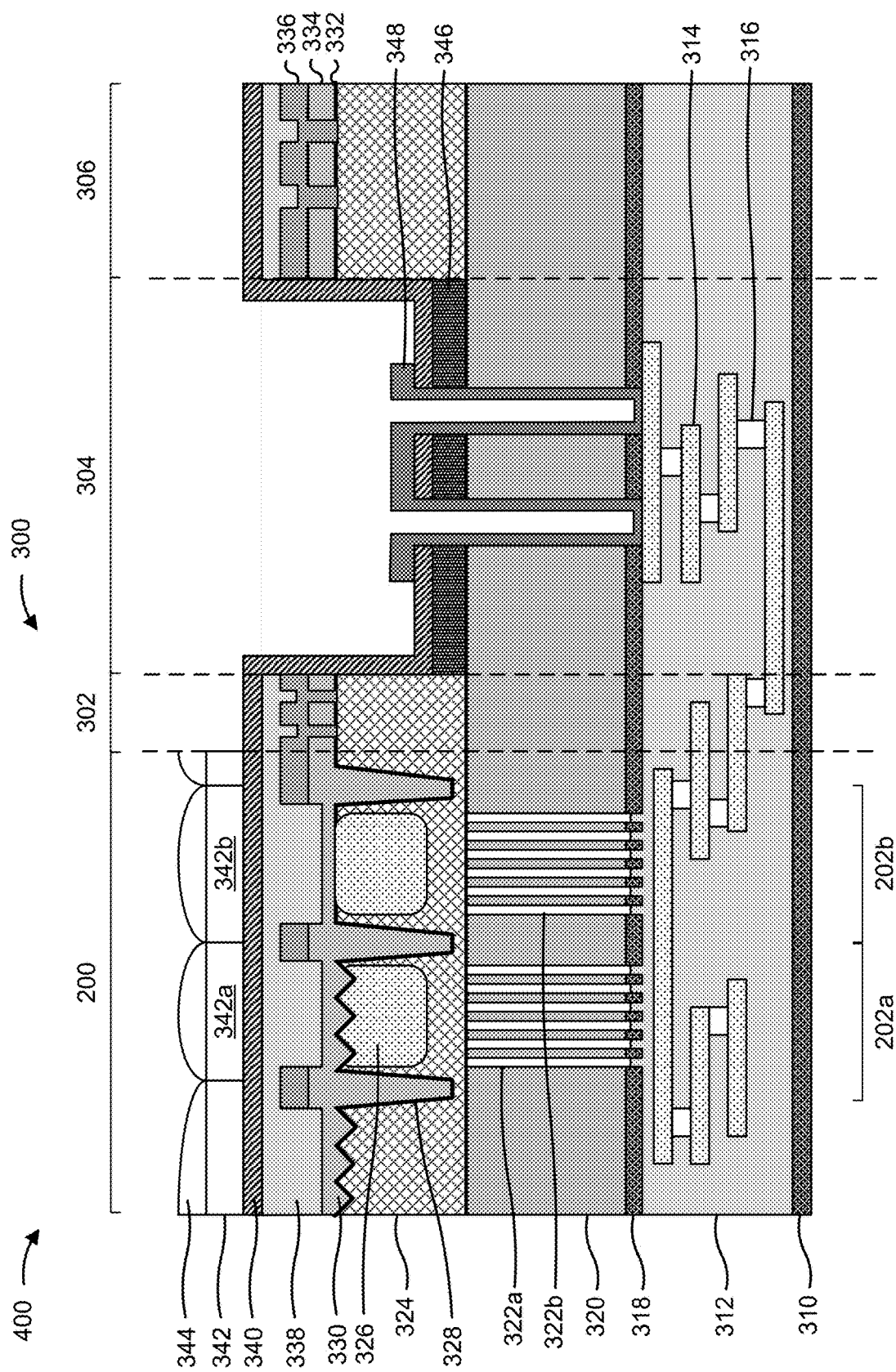

FIGS. 4A-4S are diagrams of an example implementation 400 described herein. Example implementation 400 may be an example process for forming the image sensor 300 including the pixel array 200 (which may include a plurality of pixel sensors 202, such as the pixel sensor 202a and the pixel sensor 202b), or a portion thereof. As shown in FIG. 4A, the image sensor 300 may include the pixel array 200, the metal shield region 302, the bonding pad region 304, and the scribe line region 306. Moreover, the image sensor 300 may include the substrate layer 324, the STI structure 346 formed in the substrate layer 324, the ILD layer 320 formed on the substrate layer 324, and the USG layer 318 formed on the ILD layer 320.

As shown in FIG. 4B, one or more semiconductor processing tools may form a plurality of openings 402 through the USG layer 318 and at least partially in the ILD layer 320. For example, the deposition tool 102 may form a photoresist layer on the USG layer 318, the exposure tool 104 may expose the photoresist layer to a radiation source to pattern the photoresist layer, the developer tool 106 may develop and remove portions of the photoresist layer to expose the pattern, the etch tool 108 may etch a plurality of portions of the USG layer 318 and a plurality of portions of the ILD layer 320 to form the plurality of openings 402. In particular, the etch tool 108 may etch through the USG layer 318 and at least partially into the ILD layer 320 to form the plurality of openings 402. In some implementations, a photoresist removal tool removes the remaining portions of the photoresist layer (e.g., using a chemical stripper and/or another technique) after the etch tool 108 etches the portions of the USG layer 318 and the portions of the ILD layer 320.

In some implementations, the one or more semiconductor processing tools form a plurality of sets of openings 402 through the USG layer 318 and at least partially in the ILD layer 320, where each set of openings 402 is formed for a respective pixel sensor 202 of the pixel array 200. For example, the one or more semiconductor processing tools may form a set of one or more openings 402a through the USG layer 318 and at least partially in the ILD layer 320 for the pixel sensor 202a, may form another set of one or more openings 402b through the USG layer 318 and at least partially in the ILD layer 320 for the pixel sensor 202b, and so on. Each set of one or more openings 402 may include one or more holes, one or more trenches, openings of other shapes, or a combination thereof. In some implementations, the one or more semiconductor processing tools form the size (e.g., depth and/or width), aspect ratio, shape, arrangement, and/or quantity of the openings 402 for a pixel sensor 202 based on the size of the pixel sensor 202 (e.g., larger openings 402 and/or a greater quantity of openings 402 may be formed for larger pixel sensors relative to smaller pixel sensors), based on a quantity of air gap reflection structures that are to be formed for the pixel sensor 202, and/or based on other aspects and/or attributes of the pixel sensor 202.

In some implementations, the one or more semiconductor processing tools form the plurality of openings 402 to satisfy and/or to achieve one or more performance parameters or thresholds for the pixel array 200 (and/or for the image sensor 300). For example, the one or more semiconductor processing tools may form a particular quantity of openings 402 for a pixel sensor 202 to satisfy a quantum efficiency threshold for the pixel sensor 202, or to achieve a particular quantum efficiency for the pixel sensor 202. As another example, the one or more semiconductor processing tools may form a particular quantity of openings 402 for a pixel sensor 202 to satisfy a strength parameter or to achieve a particular structural integrity for the pixel sensor 202.

As another example, the one or more semiconductor processing tools may form the plurality of openings 402 for a pixel sensor 202 such that the resulting air gap reflection structures for the pixel sensor 202 have an aspect ratio, between the depth of the air gap reflection structures and a width of the air gap reflection structures, of greater than approximately 2. The aspect ratio of greater than approximately 2 may provide suitable photon reflection performance for the pixel sensor 202 (thereby increasing the quantum efficiency threshold for the pixel sensor 202) while maintaining a sufficient strength for the ILD layer 320 and/or one or more other layers of the image sensor 300 (e.g., to reduce and/or minimize the likelihood that the ILD layer 320 and/or the one or more other layers will collapse).

In other examples, the one or more semiconductor processing tools may form the plurality of openings 402 to a particular shape (or shapes), may form the plurality of openings 402 in a particular arrangement or configuration, may form the plurality of openings 402 to a particular size and/or aspect ratio, and/or may form other aspects and/or attributes of the plurality of openings 402 so as to satisfy and/or to achieve one or more performance parameters or thresholds for the pixel array 200 (and/or for the image sensor 300).

As shown in FIG. 4C, one or more semiconductor processing tools may form the IMD layer 312 below and/or over the ILD layer 320, and over and/or on the USG layer 318. For example, the deposition tool 102 may deposit the IMD layer 312 using a CVD technique, a PVD technique, an ALD technique, or another type of deposition technique. The formation of the IMD layer 312 may close the openings 402 to form a plurality of air gap reflection structures 322 (e.g., a first set of one or more air gap reflection structures 322a for the pixel sensor 202a and a second set of one or more air gap reflection structures 322b for the pixel sensor 202b, and so on). The deposition tool 102 may deposit the material of the IMD layer 312 at a particular deposition rate, or a deposition rate that satisfies a threshold deposition rate, such that the openings 402 are closed or sealed by the IMD layer 312 before the openings 402 can be filled with the material of the IMD layer 312. In this way, air gaps or voids are formed in the openings 402, resulting in the formation of the air gap reflection structures 322. In some implementations, the deposition tool 102 deposits the material of the IMD layer 312 at a deposition rate in a range from approximately 2 angstroms per second (A/S) to approximately 300 A/S to cause the openings 402 to be closed or sealed by the IMD layer 312 such that the openings 402 are not filled with the material of the IMD layer 312.

As further shown in FIG. 4C, one or more semiconductor processing tools may form the metallization layers 314 and the contacts 316 in the IMD layer 312. In some implementations, each metallization layer 314 and each contact 316 may be formed using a deposition operation or a plating operation. For example, the plating tool 112 may apply a voltage across an anode formed of a plating material and a cathode (e.g., a substrate). The voltage causes a current to oxidize the anode, which causes the release of plating material ions from the anode. These plating material ions form a plating solution that travels through a plating bath toward the substrate. The plating solution reaches the substrate and deposits plating material in and/or on the IMD layer 312 to form the metallization layers 314 and the contacts 316.

In some implementations, forming the metallization layers 314 and the contacts 316 may include a plurality of plating operations. For example, a first portion of the IMD layer 312 may be formed, and the metallization layer 314a may be formed in the first portion of the IMD layer 312. A second portion of the IMD layer 312 may be formed, and the metallization layer 314b (and the contacts 316 connecting the metallization layer 314a and the metallization layer 314b) may be formed in the second portion of the IMD layer 312. A third portion of the IMD layer 312 may be formed, and the metallization layer 314c (and the contacts 316 connecting the metallization layer 314b and the metallization layer 314c) may be formed in the third portion of the IMD layer 312. A fourth portion of the IMD layer 312 may be formed over the metallization layer 314c to electrically insulate the metallization layer 314c.

As shown in FIG. 4D, one or more semiconductor processing tools may form the buffer layer 310 over and/or on the IMD layer 312. For example, the deposition tool 102 may deposit the buffer layer 310 on the IMD layer 312. In some implementations, the deposition tool 102 may deposit the buffer layer 310 using a CVD technique, a PVD technique, an ALD technique, or another type of deposition technique. The image sensor 300 may be bonded or attached to a carrier substrate using the buffer layer 310 so that back side processing may be performed on the image sensor 300 to form one or more layers and/or structures on the back side of the image sensor 300 (e.g., on the side of the substrate layer 324 opposing the side of the substrate layer 324 on which the ILD layer 320 is formed).

As shown in FIG. 4E, one or more semiconductor processing tools may form a plurality of photodiodes 326 in the substrate layer 324. For example, the implantation tool 114 may dope the portions of the substrate layer 324 using an ion implantation technique to form a respective photodiode 326 for each of the pixel sensors 202, such as the pixel sensor 202a and the pixel sensor 202b. The substrate layer 324 may be doped with a plurality of types of ions to form a p-n junction for each photodiode 326. For example, the substrate layer 324 may be doped with an n-type dopant to form a first portion (e.g., an n-type portion) of a photodiode 326 and a p-type dopant to form a second portion (e.g., a p-type portion) of the photodiode 326. In some implementations, another technique is used to form the photodiodes 326 such as diffusion.

The one or more semiconductor processing tools may form the photodiodes 326 over and/or above the air gap reflection structures 322. In this way, the air gap reflection structures 322 are positioned to reflect photons of incident light toward the photodiodes 326 (e.g., which reduces refraction, diffusion, and/or scattering of photons to the ILD layer 320 and/or other layers below the photodiodes 326).

As shown in FIG. 4F, a plurality of DTI structures 328 may be formed in the substrate layer 324. In particular, a DTI structure 328 may be formed between each of the photodiodes 326 of the pixel sensors 202. As an example, a DTI structure 328 may be formed between the photodiodes 326 of the pixel sensor 202a and the pixel sensor 202b, a DTI structure 328 may be formed between the photodiodes 326 of the pixel sensor 202a and another adjacent pixel sensor 202, a DTI structure 328 may be formed between the photodiodes 326 of the pixel sensor 202b and another adjacent pixel sensor 202, and so on.

In some implementations, one or more semiconductor processing tools may be used to form the DTI structures 328 in the substrate layer 324. For example, the deposition tool 102 may form a photoresist layer on the substrate layer 324, the exposure tool 104 may expose the photoresist layer to a radiation source to pattern the photoresist layer, the developer tool 106 may develop and remove portions of the photoresist layer to expose the pattern, and the etch tool 108 may etch the portions of substrate layer 324 to form the DTI structures 328 in the substrate layer 324. In some implementations, a photoresist removal tool removes the remaining portions of the photoresist layer (e.g., using a chemical stripper and/or another technique) after the etch tool 108 etches the substrate layer 324.

As further shown in FIG. 4F, one or more high absorption regions 330 may be formed in the substrate layer 324 and/or in one or more of the photodiodes 326. Each high absorption region 330 may be defined by a shallow trench. A plurality of adjacent high absorption regions 330 may form a periodic or zig-zag structure that is etched or otherwise formed in the substrate layer 324 and/or the photodiode(s) 326. The one or more high absorption regions 330 may be formed in a same side of the substrate layer 324 as the DTI structures 328, and may be formed using similar techniques and/or semiconductor processes as described above in connection with forming the DTI structures 328.

In some implementations, each of the pixel sensors 202 included in the pixel array 200 includes one or more high absorption regions 330. In some implementations, a subset of the pixel sensors 202 include one or more high absorption regions 330, and the one or more high absorption regions 330 are omitted from another subset of the pixel sensors 202.

As shown in FIG. 4G, the ARC layer 332 may be formed above and/or on the substrate layer 324, may be formed in the DTI structures 328, and may be formed in the high absorption regions 330. In particular, a semiconductor processing tool (e.g., the deposition tool 102) may deposit the ARC layer 332 using a CVD technique, a PVD technique, an ALD technique, or another type of deposition technique. The ARC layer 332 may include a suitable material for reducing a reflection of incident light projected toward the photodiodes 326. In some implementations, the semiconductor processing tool may form the ARC layer 332 to a thickness in a range from approximately 200 angstroms to approximately 1000 angstroms.

As shown in FIG. 4H, the one or more DTI structures 328 and the one or more high absorption regions 330 may each be filled with an oxide material. In particular, a semiconductor processing tool (e.g., the deposition tool 102) may deposit the oxide material such that the oxide layer 334 is formed in the DTI structures 328, in the high absorption regions 330, and over the substrate layer 324. The semiconductor processing tool may deposit the oxide material using various CVD techniques and/or ALD techniques, such as PECVD, HDP-CVD, SACVD, or PEALD.

As shown in FIG. 4I, a plurality of openings 404 (or trenches) may be formed through the oxide layer 334 and the ARC layer 332 in the metal shield region 302, and a plurality of openings 406 (or trenches) may be formed through the oxide layer 334 and the ARC layer 332 to the substrate layer 324 in the scribe line region 306. The openings 404 and 406 may be formed by coating the oxide layer 334 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 404 and 406 into the oxide layer 334 and the ARC layer 332 to the substrate layer 324 (e.g., using the etch tool 108) based on the pattern in the photoresist.

As shown in FIG. 4J, the metal shielding layer 336 may be formed over and/or on the oxide layer 334 and in the openings 404 and 406. The metal shielding layer 336 may provide shielding for the components and/or devices formed in the metal shield region 602 and in the scribe line region 306. The metal shielding layer 336 may be formed of a metal material, such as gold, silver, aluminum, a metal alloy, or a similar metal. In some implementations, a semiconductor processing tool (e.g., the plating tool 112) may form the metal shielding layer 336 using a plating technique such as electroplating (or electro-chemical deposition). In these examples, the semiconductor processing tool may apply a voltage across an anode formed of a plating material and a cathode (e.g., a substrate). The voltage causes a current to oxidize the anode, which causes the release of plating material ions from the anode. These plating material ions form a plating solution that travels through a plating bath toward the image sensor 300. The plating solution reaches the image sensor 300 and deposits plating material ions onto the oxide layer 334 and in the openings 404 and 406 to form the metal shielding layer 336.

As shown in FIG. 4K, an opening 410 (or a trench) may be formed through the metal shielding layer 336 and in a portion of the oxide layer 334 in the bonding pad region 304, and a plurality of openings 408 (or trenches) may be formed through the metal shielding layer 336 and in a portion of the oxide layer 334 in the pixel array 200. The openings 408 and 410 may be formed by coating the metal shielding layer 336 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 408 and 410 into the metal shielding layer and in a portion of the oxide layer 334 (e.g., using the etch tool 108) based on the pattern in the photoresist.

As shown in FIG. 4L, the BSI oxide layer 338 may be formed in the openings 408 and 410, and over the metal shielding layer 336 and the oxide layer 334. In particular, a semiconductor processing tool (e.g., the deposition tool 102) may deposit an oxide material (e.g., a silicon oxide ($SiO_x$) or another type of oxide) such that the BSI oxide layer 338 is formed using various CVD techniques and/or ALD techniques, such as PECVD, HDP-CVD, SACVD, or PEALD.

As shown in FIG. 4M, the BSI oxide layer 338 may be planarized. In particular, a semiconductor processing tool (e.g., the planarization tool 110) may perform a planarization or polishing process such as CMP. A CMP process may include depositing a slurry (or polishing compound) onto a polishing pad. The carrier substrate including the image sensor 300 may be mounted to a carrier, which may rotate the carrier substrate as the carrier substrate is pressed against the polishing pad. The slurry and polishing pad act as an abrasive that polishes or planarizes the BSI oxide layer 338 as the carrier substrate is rotated. The polishing pad may also be rotated to ensure a continuous supply of slurry is applied to the polishing pad.

As shown in FIG. 4N, an opening 412 (or trench) may be formed in the bonding pad region 304. In particular the opening 412 may be formed through the BSI oxide layer 338, through the metal shielding layer 336, through the oxide layer 334, through the ARC layer 332, and through the substrate layer 324 to the STI structure 346. The opening 412 may be formed by coating the BSI oxide layer 338 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the opening 412 (e.g., using the etch tool 108) based on the pattern in the photoresist.

As shown in FIG. 4O, the buffer oxide layer 340 may be formed over the BSI oxide layer 338 and over the STI structure 346 in the opening 412. In particular, a semiconductor processing tool (e.g., the deposition tool 102) may deposit an oxide material (e.g., a silicon oxide ($SiO_x$) or another type of oxide) such that the buffer oxide layer 340 is formed using various CVD techniques and/or ALD techniques, such as PECVD, HDP-CVD, SACVD, or PEALD.

As shown in FIG. 4P, openings 414 (or vias) may be formed in the opening 412 of the bonding pad region 304. In particular, the openings 414 may be formed through the buffer oxide layer 340, through the STI structure 346, through the ILD layer 320, and to a metallization layer 314 (e.g., the metallization layer 314a) in the IMD layer 312. The openings 414 may be formed by coating the buffer oxide layer 340 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 414 (e.g., using the etch tool 108) based on the pattern in the photoresist.

As shown in FIG. 4Q, the bonding pad 348 may be formed in the openings 414. For example, a semiconductor processing tool (e.g., the deposition tool 102 or the plating tool 112) may form a metal layer (e.g., an aluminum layer, a gold layer, a silver layer, a metal alloy layer, or another type of metal layer) on the buffer oxide layer 340, on the STI structure 346, and in the openings 414. Portions of the metal layer may be removed by coating the metal layer with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the portions (e.g., using the etch tool 108) based on the pattern in the photoresist to form the bonding pad 348.

As shown in FIG. 4R, the filter layer 342 is formed for the pixel sensors in the pixel array 200. The filter layer 342 may be formed over and/or on the buffer oxide layer 340. In some implementations, a semiconductor processing tool (e.g., the deposition tool 102) may deposit the filter layer 342 using a CVD technique, a PVD technique, an ALD technique, or another type of deposition technique. As shown in FIG. 4S, a micro-lens layer 344 including a plurality of micro-lenses is formed over and/or on the filter layer 342. The micro-lens layer 344 may include a respective micro-lens for each of the pixel sensors 202 included in the pixel array 200.

As indicated above, FIGS. 4A-4S are provided as an example. Other examples may differ from what is described with regard to FIGS. 4A-4S.

Figure 5:
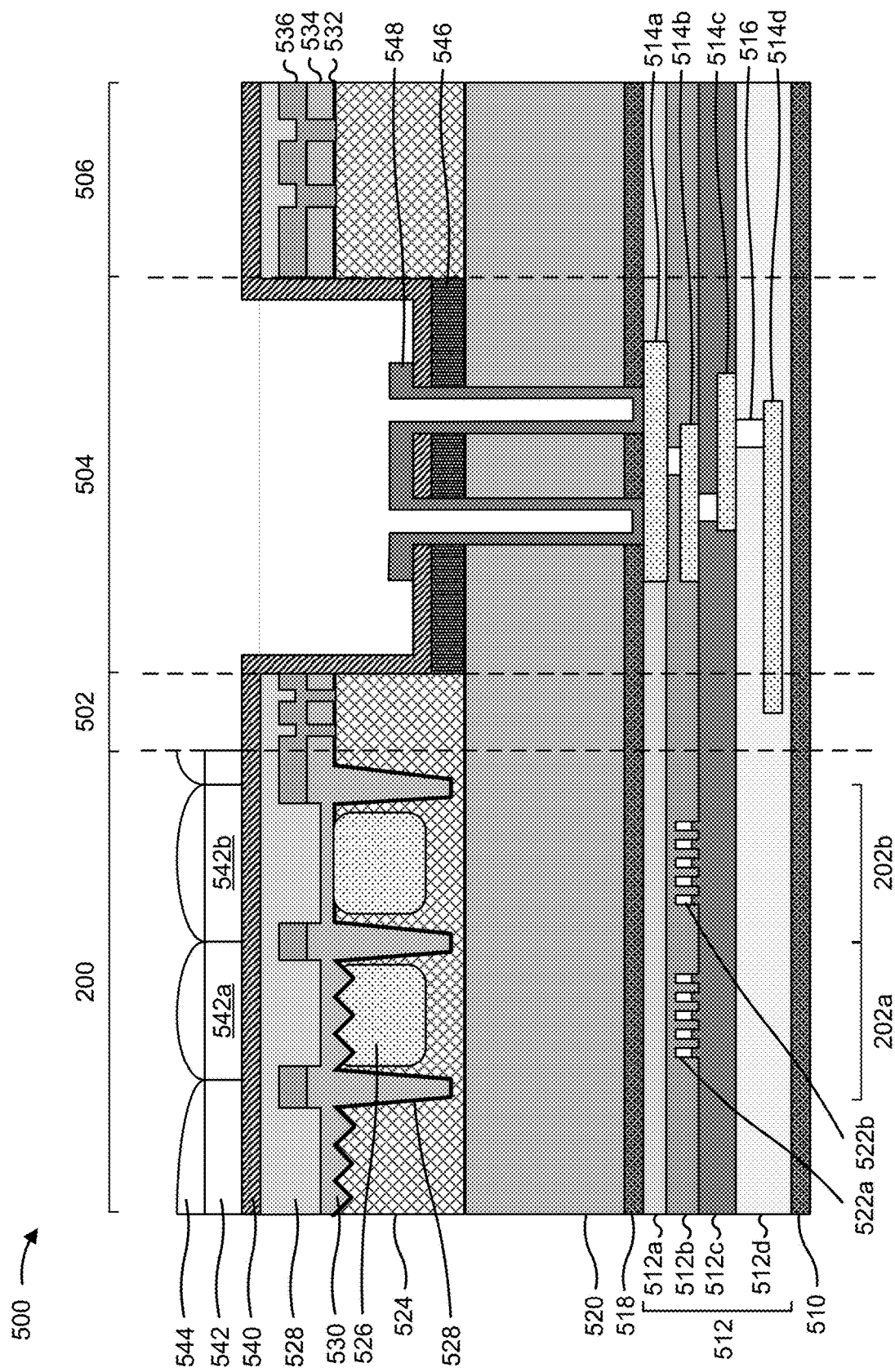
FIGS. 5-7 are diagrams of example image sensors described herein.

FIG. 5 is a diagram of an example image sensor 500 (or a portion thereof) described herein. The image sensor 500 includes another example of an image sensor that includes one or more air gap reflection structures under the photodiodes of one or more pixel sensors of the image sensor to reflect photons that would otherwise partially refract or scatter through a bottom surface of the photodiodes. As shown in FIG. 5, the image sensor 500 may include similar regions as the image sensor 300 of FIG. 3, such as the pixel array 200, a metal shield region 502, a bonding pad region 504, and a scribe line region 506. The pixel array 200 may include the pixel sensors 202 of the image sensor 500, such as pixel sensor 202a and pixel sensor 202b. In some implementations, the image sensor 300 includes a greater quantity of pixel sensors 202 or fewer pixel sensors 202 than the quantity of pixel sensors illustrated in FIG. 5.

As further shown in FIG. 5, the image sensor 500 may include similar layers and structures as the image sensor 300 of FIG. 3, such as a buffer layer 510, an ILD layer 520 above and/or on the buffer layer 510, a plurality of metallization layers 514 and a plurality of contacts 516 in the IMD layer 512, a USG layer 518 above and/or on the IMD layer 512, an ILD layer 520 above and/or on the IMD layer 512, a plurality of air gap reflection structures 522 (e.g., one or more air gap reflection structures 522a included in pixel sensor 202a, one or more air gap reflection structures 522b included in the pixel sensor 202b, and so on), and a substrate layer 524 above and/or on the ILD layer 520. Moreover, the image sensor 500 may include photodiodes 526 and DTI structures 528 in the substrate layer 524 for each of the pixel sensors 202, one or more high absorption regions 330 in the substrate layer 324 and in one or more photodiodes 526, an ARC layer 532 above and/or on the substrate layer 524, an oxide layer 534 above and/or on the ARC layer 532, a metal shielding layer 536 above and/or on the oxide layer 534, a BSI oxide layer 538 above and/or on portions of the oxide layer 534 and the metal shielding layer 536, a buffer oxide layer 540 above and/or on the BSI oxide layer 538, a filter layer 542 above and/or on the buffer oxide layer 540 (e.g., including filter 542a, filter 542b, and/or other filters), and micro-lens layer 544 above and/or on the filter layer 542. In addition, the image sensor 500 may include an STI structure 546 may be located above and/or on the ILD layer 520 in the bonding pad region 504, and a bonding pad 548 in the bonding pad region 504 above the STI structure 546 and above and/or on the buffer oxide layer 540.

As further shown in FIG. 5, the IMD layer 512 of the image sensor 500 may include a plurality of layers or portions that may be formed over a plurality of deposition operations performed by the deposition tool 102 and/or another semiconductor processing tool. The plurality of layers may include a first layer 512a formed over and/or on the ILD layer 520, a second layer 512b formed over and/or the first layer 512a, a third layer 512c formed over and/or on the second layer 512b, a fourth layer 512d formed over and/or on the third layer 512c, and so on.

Moreover, the metallization layers 514 and the contacts 516 may be formed as part of a deposition operation to form a layer of the IMD layer 512 or in between deposition operations. For example, a metallization layer 514a and/or one or more contacts 516 may be formed (e.g., by deposition tool 102, plating tool 112, and/or another semiconductor processing tool) as part of the deposition operation to form the first layer 512a and/or in between the deposition operation to form the first layer 512a and the deposition operation to form the second layer 512b. As another example, a metallization layer 514b and one or more contacts 516 may be formed (e.g., by deposition tool 102, plating tool 112, and/or another semiconductor processing tool) as part of the deposition operation to form the second layer 512b and/or in between the deposition operation to form the second layer 512b and the deposition operation to form the third layer 512c. As another example, a metallization layer 514c and one or more contacts 516 may be formed (e.g., by deposition tool 102, plating tool 112, and/or another semiconductor processing tool) as part of the deposition operation to form the third layer 512c and/or in between the deposition operation to form the third layer 512c and the deposition operation to form the fourth layer 512d. As another example, a metallization layer 514d and one or more contacts 516 may be formed (e.g., by deposition tool 102, plating tool 112, and/or another semiconductor processing tool) as part of the deposition operation to form the fourth layer 512d and/or in between the deposition operation to form the fourth layer 512d and the deposition operation to form the buffer layer 510.

As further shown in FIG. 5, the air gap reflection structures 522 may be formed in the IMD layer 512 (as opposed to the ILD layer 520). As shown in the example in FIG. 5, the air gap reflection structures 522 may be formed and included in the second layer 512b of the IMD layer 512. In some implementations, the air gap reflection structures 522 are formed and included in other layers of the IMD layer 512, such as the first layer 512a. In some implementations, the air gap reflection structures 522 are formed and included in a plurality of layers of the IMD layer 512.

The image sensor 500 may be formed using similar techniques and/or operations described above in connection with FIGS. 4A-4S. In some implementations, the air gap reflection structures 522 are formed in the IMD layer 512 by depositing (e.g., using the deposition tool 102) the first layer 512a over and/or on the ILD layer 520, depositing (e.g., using the deposition tool 102) the second layer 512b over and/or on the first layer 512a, forming (e.g., using the deposition tool 102, the exposure tool 104, the developer tool 106, the etch tool 108, and/or another semiconductor processing tool) one or more openings at least partially in the second layer 512b, and depositing (e.g., using the deposition tool 102) the third layer 512c over and/or on the second layer 512b at a deposition rate that causes the opening(s) to be closed or sealed before the material of the third layer 512c fills the opening(s).

The number and arrangement of components, structures, and/or layers shown in the image sensor 500 of FIG. 5 are provided as an example. In practice, the image sensor 500 may include additional components, structures, and/or layers; fewer components, structures, and/or layers; different components, structures, and/or layers; and/or differently arranged components, structures, and/or layers than those shown in FIG. 5.

Figure 6:
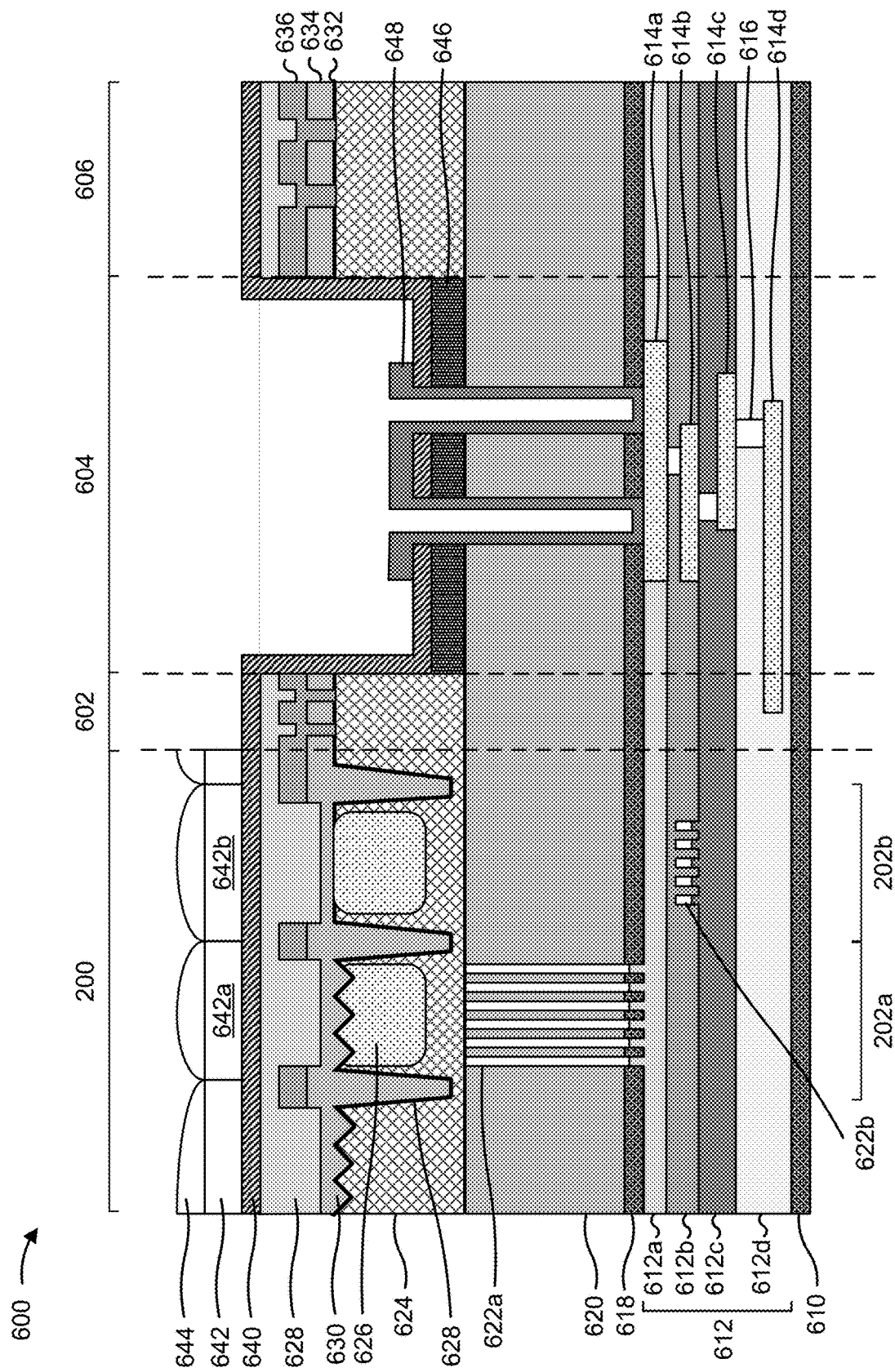

FIG. 6 is a diagram of an example image sensor 600 (or a portion thereof) described herein. The image sensor 600 includes another example of an image sensor that includes one or more air gap reflection structures under the photodiodes of one or more pixel sensors of the image sensor to reflect photons that would otherwise partially refract or scatter through a bottom surface of the photodiodes. As shown in FIG. 6, the image sensor 600 may include similar regions as the image sensor 300 of FIG. 3, such as the pixel array 200, a metal shield region 602, a bonding pad region 604, and a scribe line region 606. The pixel array 200 may include the pixel sensors 202 of the image sensor 600, such as pixel sensor 202a and pixel sensor 202b. In some implementations, the image sensor 300 includes a greater quantity of pixel sensors 202 or fewer pixel sensors 202 than the quantity of pixel sensors illustrated in FIG. 6.

As further shown in FIG. 6, the image sensor 600 may include similar layers and structures as the image sensor 300 of FIG. 3, such as a buffer layer 610, an ILD layer 620 above and/or on the buffer layer 610, a plurality of metallization layers 614 and a plurality of contacts 616 in the IMD layer 612, a USG layer 618 above and/or on the IMD layer 612, an ILD layer 620 above and/or on the IMD layer 612, a plurality of air gap reflection structures 622 (e.g., one or more air gap reflection structures 622a included in pixel sensor 202a, one or more air gap reflection structures 622b included in the pixel sensor 202b, and so on), and a substrate layer 624 above and/or on the ILD layer 620. Moreover, the image sensor 600 may include photodiodes 626 and DTI structures 628 in the substrate layer 624 for each of the pixel sensors 202, one or more high absorption regions 330 in the substrate layer 324 and in one or more photodiodes 626, an ARC layer 632 above and/or on the substrate layer 624, an oxide layer 634 above and/or on the ARC layer 632, a metal shielding layer 636 above and/or on the oxide layer 634, a BSI oxide layer 638 above and/or on portions of the oxide layer 634 and the metal shielding layer 636, a buffer oxide layer 640 above and/or on the BSI oxide layer 638, a filter layer 642 above and/or on the buffer oxide layer 640 (e.g., including filter 642a, filter 642b, and/or other filters), and micro-lens layer 644 above and/or on the filter layer 642. In addition, the image sensor 600 may include an STI structure 646 may be located above and/or on the ILD layer 620 in the bonding pad region 604, and a bonding pad 648 in the bonding pad region 604 above the STI structure 646 and above and/or on the buffer oxide layer 640.

As further shown in FIG. 6, the IMD layer 612 of the image sensor 600 may include a plurality of layers or portions that may be formed over a plurality of deposition operations performed by the deposition tool 102 and/or another semiconductor processing tool. The plurality of layers may include a first layer 612a formed over and/or on the ILD layer 620, a second layer 612b formed over and/or the first layer 612a, a third layer 612c formed over and/or on the second layer 612b, a fourth layer 612d formed over and/or on the third layer 612c, and so on.

Moreover, the metallization layers 614 and the contacts 616 may be formed as part of a deposition operation to form a layer of the IMD layer 612 or in between deposition operations. For example, a metallization layer 614a and/or one or more contacts 616 may be formed (e.g., by deposition tool 102, plating tool 112, and/or another semiconductor processing tool) as part of the deposition operation to form the first layer 612a and/or in between the deposition operation to form the first layer 612a and the deposition operation to form the second layer 612b. As another example, a metallization layer 614b and one or more contacts 616 may be formed (e.g., by deposition tool 102, plating tool 112, and/or another semiconductor processing tool) as part of the deposition operation to form the second layer 612b and/or in between the deposition operation to form the second layer 612b and the deposition operation to form the third layer 612c. As another example, a metallization layer 614c and one or more contacts 616 may be formed (e.g., by deposition tool 102, plating tool 112, and/or another semiconductor processing tool) as part of the deposition operation to form the third layer 612c and/or in between the deposition operation to form the third layer 612c and the deposition operation to form the fourth layer 612d. As another example, a metallization layer 614d and one or more contacts 616 may be formed (e.g., by deposition tool 102, plating tool 112, and/or another semiconductor processing tool) as part of the deposition operation to form the fourth layer 612d and/or in between the deposition operation to form the fourth layer 612d and the deposition operation to form the buffer layer 610.

As further shown in FIG. 6, a first subset of the air gap reflection structures 622 (e.g., the air gap reflection structure(s) 622a) may be formed in the ILD layer 620, and a second subset of the air gap reflection structures 622 (e.g., the air gap reflection structure(s) 622b) may be formed in the IMD layer 612 (e.g., in one or more layers of the IMD layer 612). In this way, a first subset of pixel sensors 202 of the image sensor 600 may include air gap reflection structure(s) in the ILD layer 620, and a second subset of pixel sensors 202 of the image sensor 600 may include air gap reflection structure(s) in the IMD layer 612. In some implementations, air gap reflection structures 622 may be included in the IMD layer 612 or the ILD layer 620 for a pixel sensor 202 based on various factors, such as a target quantum efficiency, the availability of space in the IMD layer 612 or the ILD layer 620 for the air gap reflection structures 622, and/or other factors.

The number and arrangement of components, structures, and/or layers shown in the image sensor 600 of FIG. 6 are provided as an example. In practice, the image sensor 600 may include additional components, structures, and/or layers; fewer components, structures, and/or layers; different components, structures, and/or layers; and/or differently arranged components, structures, and/or layers than those shown in FIG. 6.

Figure 7:
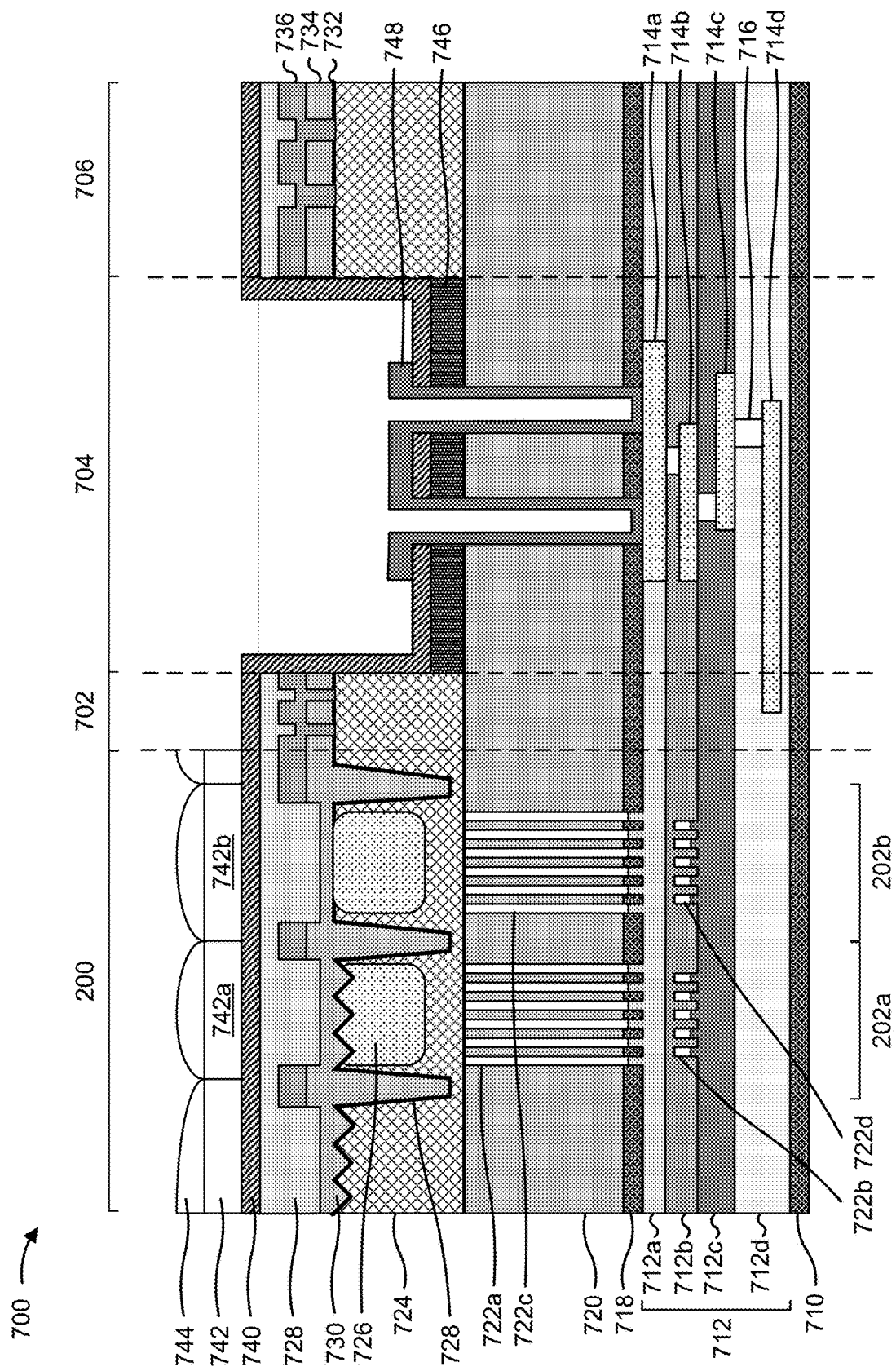

FIG. 7 is a diagram of an example image sensor 700 (or a portion thereof) described herein. The image sensor 700 includes another example of an image sensor that includes one or more air gap reflection structures under the photodiodes of one or more pixel sensors of the image sensor to reflect photons that would otherwise partially refract or scatter through a bottom surface of the photodiodes. As shown in FIG. 7, the image sensor 700 may include similar regions as the image sensor 300 of FIG. 3, such as the pixel array 200, a metal shield region 702, a bonding pad region 704, and a scribe line region 706. The pixel array 200 may include the pixel sensors 202 of the image sensor 700, such as pixel sensor 202a and pixel sensor 202b. In some implementations, the image sensor 300 includes a greater quantity of pixel sensors 202 or fewer pixel sensors 202 than the quantity of pixel sensors illustrated in FIG. 7.

As further shown in FIG. 7, the image sensor 700 may include similar layers and structures as the image sensor 300 of FIG. 3, such as a buffer layer 710, an IMD layer 712 above and/or on the buffer layer 710, a plurality of metallization layers 714 and a plurality of contacts 716 in the IMD layer 712, a USG layer 718 above and/or on the IMD layer 712, an ILD layer 720 above and/or on the IMD layer 712, a plurality of air gap reflection structures 722, and a substrate layer 724 above and/or on the ILD layer 720. Moreover, the image sensor 700 may include photodiodes 726 and DTI structures 728 in the substrate layer 724 for each of the pixel sensors 202, one or more high absorption regions 330 in the substrate layer 324 and in one or more photodiodes 726, an ARC layer 732 above and/or on the substrate layer 724, an oxide layer 734 above and/or on the ARC layer 732, a metal shielding layer 736 above and/or on the oxide layer 734, a BSI oxide layer 738 above and/or on portions of the oxide layer 734 and the metal shielding layer 736, a buffer oxide layer 740 above and/or on the BSI oxide layer 738, a filter layer 742 above and/or on the buffer oxide layer 740 (e.g., including filter 742a, filter 742b, and/or other filters), and micro-lens layer 744 above and/or on the filter layer 742. In addition, the image sensor 700 may include an STI structure 746 may be located above and/or on the ILD layer 720 in the bonding pad region 704, and a bonding pad 748 in the bonding pad region 704 above the STI structure 746 and above and/or on the buffer oxide layer 740.

As further shown in FIG. 7, the IMD layer 712 of the image sensor 700 may include a plurality of layers or portions that may be formed over a plurality of deposition operations performed by the deposition tool 102 and/or another semiconductor processing tool. The plurality of layers may include a first layer 712a formed over and/or on the ILD layer 720, a second layer 712b formed over and/or the first layer 712a, a third layer 712c formed over and/or on the second layer 712b, a fourth layer 712d formed over and/or on the third layer 712c, and so on.

Moreover, the metallization layers 714 and the contacts 716 may be formed as part of a deposition operation to form a layer of the IMD layer 712 or in between deposition operations. For example, a metallization layer 714a and/or one or more contacts 716 may be formed (e.g., by deposition tool 102, plating tool 112, and/or another semiconductor processing tool) as part of the deposition operation to form the first layer 712a and/or in between the deposition operation to form the first layer 712a and the deposition operation to form the second layer 712b. As another example, a metallization layer 714b and one or more contacts 716 may be formed (e.g., by deposition tool 102, plating tool 112, and/or another semiconductor processing tool) as part of the deposition operation to form the second layer 712b and/or in between the deposition operation to form the second layer 712b and the deposition operation to form the third layer 712c. As another example, a metallization layer 714c and one or more contacts 716 may be formed (e.g., by deposition tool 102, plating tool 112, and/or another semiconductor processing tool) as part of the deposition operation to form the third layer 712c and/or in between the deposition operation to form the third layer 712c and the deposition operation to form the fourth layer 712d. As another example, a metallization layer 714d and one or more contacts 716 may be formed (e.g., by deposition tool 102, plating tool 112, and/or another semiconductor processing tool) as part of the deposition operation to form the fourth layer 712d and/or in between the deposition operation to form the fourth layer 712d and the deposition operation to form the buffer layer 710.

As further shown in FIG. 7, one or more of the pixel sensors 202 included in the image sensor 700 may include a plurality of sets of air gap reflection structures 722. For example, the pixel sensor 202a may include a first set of one or more air gap reflection structures 722a in the ILD layer 720 below the photodiode 726 of the pixel sensor 202a, and a second set of one or more air gap reflection structures 722b included the IMD layer 712 below the first set of one or more air gap reflection structures 722a. As another example, the pixel sensor 202b may include a first set of one or more air gap reflection structures 722c in the ILD layer 720 below the photodiode 726 of the pixel sensor 202b, and a second set of one or more air gap reflection structures 722d included the IMD layer 712 below the first set of one or more air gap reflection structures 722c. The first set of one or more air gap reflection structures 722a and the first set of one or more air gap reflection structures 722c may be adjacent in the ILD layer 720. The second set of one or more air gap reflection structures 722b and the second set of one or more air gap reflection structures 722b may be adjacent in the IMD layer 712.

Including a set of air gap reflection structures 722 in the ILD layer 720 for a pixel sensor 202, and another set of air gap reflection structures 722 in the IMD layer 712 for the pixel sensor 202 may further increase the quantum efficiency of the pixel sensor 202. In this way, photons of incident light that may refract, diffuse, and/or scatter through the photodiode 726 of the pixel sensor 202 that are not reflected by the air gap reflection structures 722 in the ILD layer 720 may still be reflected upward toward the photodiode 726 by the air gap reflection structures 722 in the IMD layer 712, which increases the absorption of incident light for the pixel sensor 202.

The number and arrangement of components, structures, and/or layers shown in the image sensor 700 of FIG. 7 are provided as an example. In practice, the image sensor 700 may include additional components, structures, and/or layers; fewer components, structures, and/or layers; different components, structures, and/or layers; and/or differently arranged components, structures, and/or layers than those shown in FIG. 7.

Figure 8:
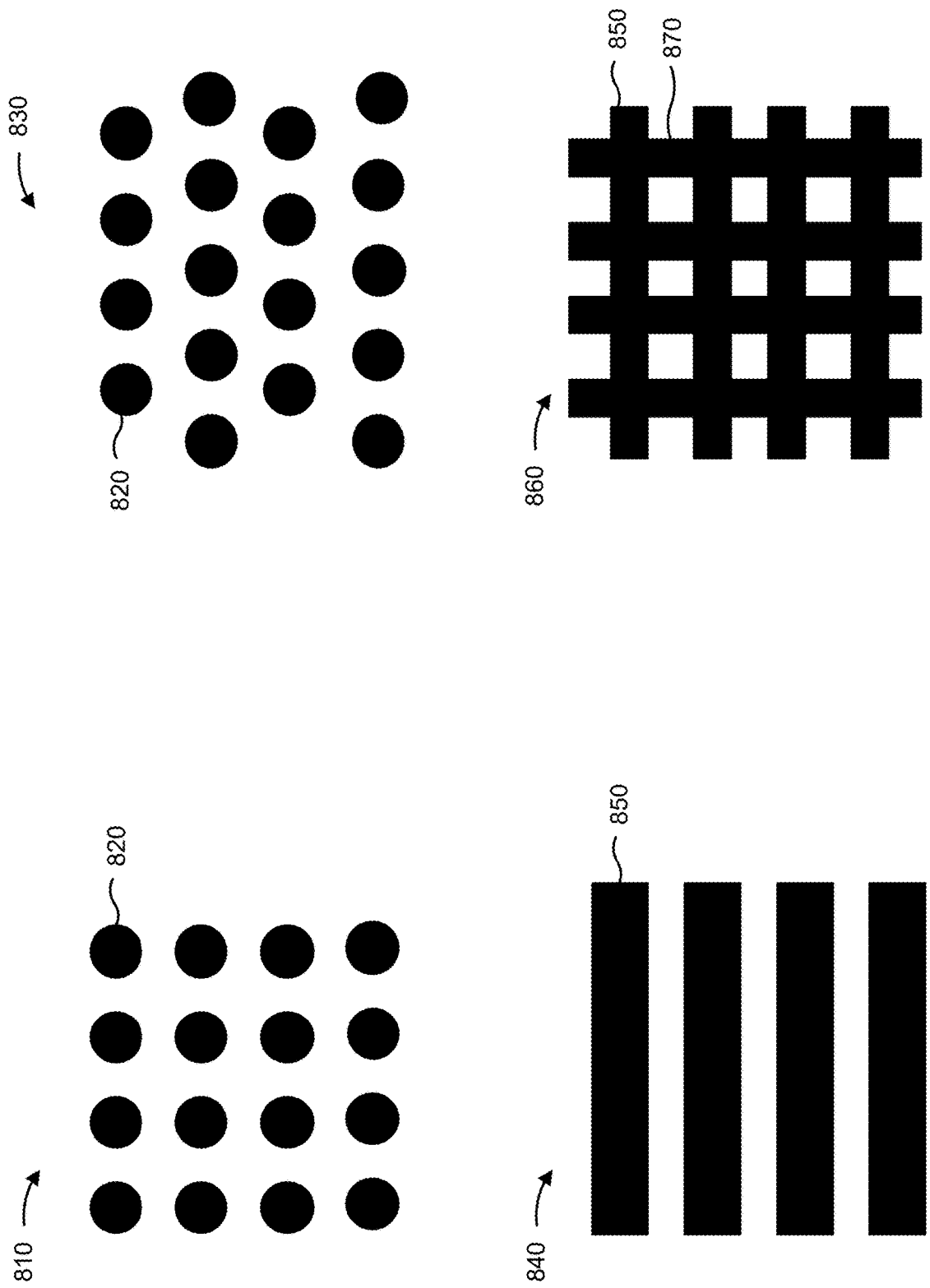
FIG. 8 is a diagram of example air gap reflection structure configurations described herein.

FIG. 8 is a diagram of example air gap reflection structure configurations described herein. In particular, FIG. 8 illustrates top-down views of example air gap reflection structure configurations for a pixel sensor 202 that may be included in the image sensor 300, the image sensor 500, the image sensor 600, the image sensor 700, and/or one or more other image sensors. As shown in FIG. 8, an example air gap reflection structure configuration 810 may include a plurality of holes 820 that extend into an ILD layer of an image sensor or into an IMD layer of the image sensor. The holes 820 may be arranged in a substantially symmetrical grid layout below the photodiode 326 of the pixel sensor 202, and may be configured to reflect photons of light upward toward the photodiode 326. In some implementations, a symmetrical grid layout of holes 820 may include a greater quantity of holes 820 or fewer holes 820. In some implementations, the holes 820 may be arranged in another symmetrical configuration, such as a reflection-symmetrical configuration, a rotational-symmetrical configuration, or a translational-symmetrical configuration, among other examples.

As further shown in FIG. 8, another example air gap reflection structure configuration 830 may include a plurality of holes 820 in a non-symmetrical (asymmetrical) arrangement. The holes 820 may be arranged in a repeating pattern (e.g., a pattern that alternates between a row of 4 holes 820 and a row of 5 holes 820), a non-standard layout, or another type of layout.

As further shown in FIG. 8, another example air gap reflection structure configuration 840 may include a plurality of trenches 850. The trenches 850 may be arranged in rows below the photodiode 326 of the pixel sensor 202. The trenches 850 may be evenly spaced, may be non-evenly spaced, or a combination thereof. The trenches 850 may be the same length, may be different lengths, or a combination thereof.

As further shown in FIG. 8, another example air gap reflection structure configuration 860 may include a first plurality of trenches 850 and a second plurality of trenches 870. The first plurality of trenches 850 may be arranged in rows, and the second plurality of trenches 870 may be arranged in rows and may extend in a direction that is substantially perpendicular to the plurality of trenches 850. In some implementations, the first plurality of trenches 850 may extend diagonally at an angle relative to the second plurality of trenches 870 (e.g., such that the first plurality of trenches 850 and the second plurality of trenches 870 are not diagonal).

As indicated above, FIG. 8 is provided as one or more examples. Other examples may differ from what is described with regard to FIG. 8. For example, other examples of air gap reflection structure configurations for a pixel sensor 202 may include a greater quantity of holes, fewer holes, differently arranged holes, a greater quantity of trenches, fewer trenches, differently arranged trenches, combinations of holes and trenches (and/or other shapes of air gap reflection structures), or a combination thereof. In some implementations, a particular air gap reflection structure configuration may be selected based on the size of a pixel sensor 202, based on one or more performance parameters for the pixel sensor 202, and/or based on other parameters.

Figure 9:
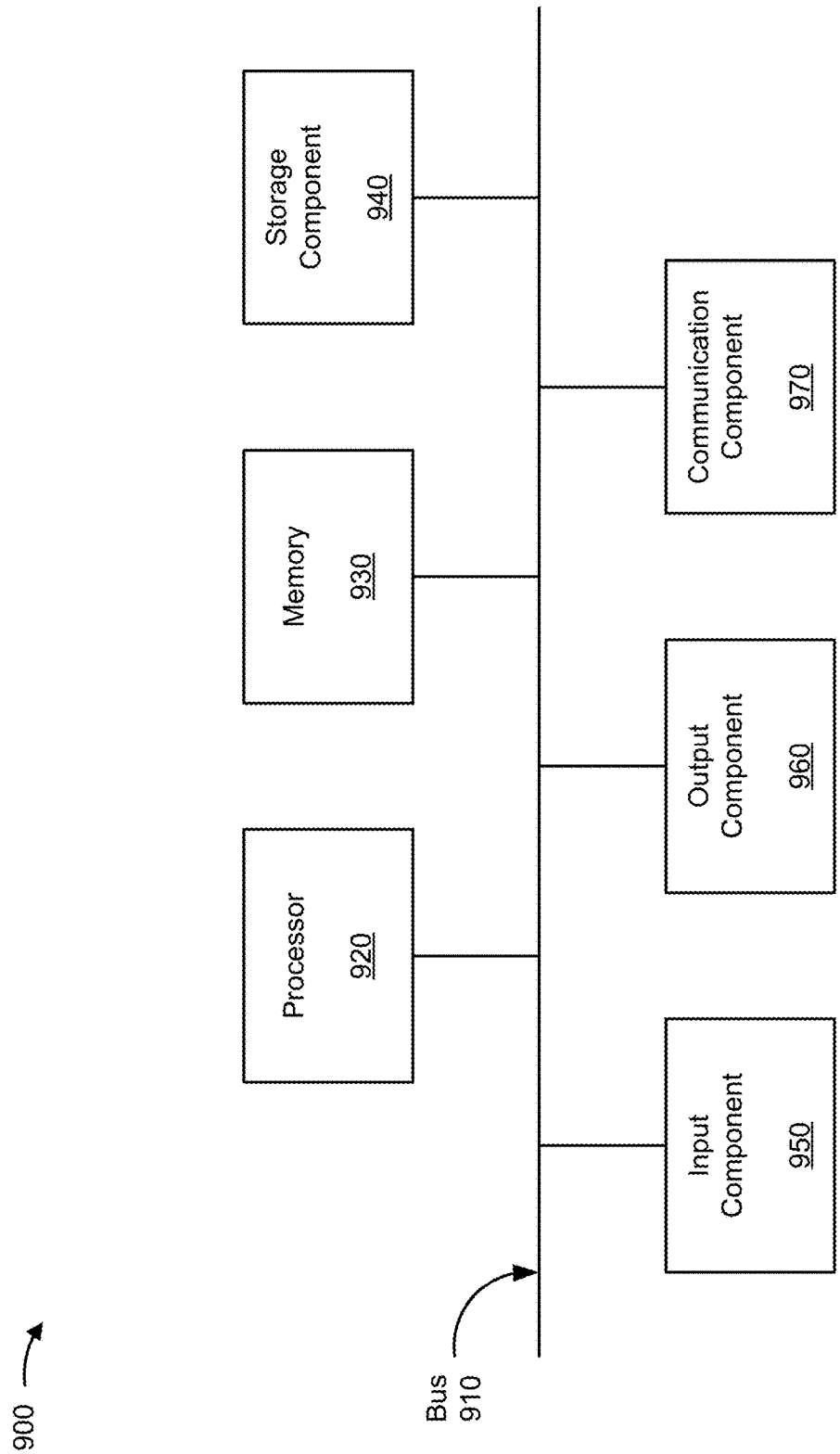
FIG. 9 is a diagram of example components of one or more devices of FIG. 1.

FIG. 9 is a diagram of example components of a device 900. In some implementations, one or more of the semiconductor processing tools 102-116 may include one or more devices 900 and/or one or more components of device 900. As shown in FIG. 9, device 900 may include a bus 910, a processor 920, a memory 930, a storage component 940, an input component 950, an output component 960, and a communication component 970.

Bus 910 includes a component that enables wired and/or wireless communication among the components of device 900. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform a function. Memory 930 includes a random access memory, a read only memory, and/or another type of memory (e.g., a flash memory, a magnetic memory, and/or an optical memory).

Storage component 940 stores information and/or software related to the operation of device 900. For example, storage component 940 may include a hard disk drive, a magnetic disk drive, an optical disk drive, a solid state disk drive, a compact disc, a digital versatile disc, and/or another type of non-transitory computer-readable medium. Input component 950 enables device 900 to receive input, such as user input and/or sensed inputs. For example, input component 950 may include a touch screen, a keyboard, a keypad, a mouse, a button, a microphone, a switch, a sensor, a global positioning system component, an accelerometer, a gyroscope, and/or an actuator. Output component 960 enables device 900 to provide output, such as via a display, a speaker, and/or one or more light-emitting diodes. Communication component 970 enables device 900 to communicate with other devices, such as via a wired connection and/or a wireless connection. For example, communication component 970 may include a receiver, a transmitter, a transceiver, a modem, a network interface card, and/or an antenna.

Device 900 may perform one or more processes described herein. For example, a non-transitory computer-readable medium (e.g., memory 930 and/or storage component 940) may store a set of instructions (e.g., one or more instructions, code, software code, and/or program code) for execution by processor 920. Processor 920 may execute the set of instructions to perform one or more processes described herein. In some implementations, execution of the set of instructions, by one or more processors 920, causes the one or more processors 920 and/or the device 900 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

FIG. 10 is a flowchart of an example process 1000 associated with forming an image sensor. In some implementations, one or more process blocks of FIG. 10 may be performed by one or more semiconductor processing tools (e.g., one or more of the semiconductor processing tools 102-116). Additionally, or alternatively, one or more process blocks of FIG. 10 may be performed by one or more components of device 900, such as processor 920, memory 930, storage component 940, input component 950, output component 960, and/or communication component 970.

As shown in FIG. 10, process 1000 may include forming, for a pixel sensor 202 of a pixel array included in an image sensor, a plurality of openings through a USG layer of the image sensor and in an ILD layer of the image sensor (block 1010). For example, one or more semiconductor processing tools (e.g., the deposition tool 102, the exposure tool 104, the developer tool 106, the etch tool 108, and/or another semiconductor processing tool) may form, for a pixel sensor (202) of a pixel array (200) included in an image sensor (300, 500, 600, 700), a plurality of openings (402a, 402b) through an USG layer (318, 518, 618, 718) of the image sensor and in an ILD layer (320, 520, 620, 720) of the image sensor, as described above.

As further shown in FIG. 10, process 1000 may include forming an IMD layer on the USG layer, where the IMD layer closes the plurality of openings to form a plurality of air gap reflection structures of the pixel sensor (block 1020). For example, a semiconductor processing tool (e.g., the deposition tool 102) may form an IMD layer (312, 512, 612, 712) on the USG layer (318, 518, 618, 718), as described above. In some implementations, the IMD layer (312, 512, 612, 712) closes the plurality of openings (402a, 402b) to form a plurality of air gap reflection structures (322, 522, 622, 722) of the pixel sensor (202).

As further shown in FIG. 10, process 1000 may include forming a photodiode in a silicon layer above the ILD layer, where the photodiode is formed over the plurality of air gap reflection structures (block 1030). For example, a semiconductor processing tool (e.g., the ion implantation tool 114) may form a photodiode (326, 526, 626, 726) in a silicon layer (324, 524, 624, 724) above the ILD layer (320, 520, 620, 720), as described above. In some implementations, the photodiode (326, 526, 626, 726) is formed over the plurality of air gap reflection structures (322, 522, 622, 722).

Process 1000 may include additional implementations, such as any single implementation or any combination of implementations described below and/or in connection with one or more other processes described elsewhere herein.

In a first implementation, forming the plurality of openings (402a, 402b) includes forming a quantity of the plurality of openings (402a, 402b) based on a size of the pixel sensor (202). In a second implementation, alone or in combination with the first implementation, forming the plurality of openings (402a, 402b) includes forming each of the plurality of openings (402a, 402b) to at least one of a particular depth or a particular width based on at least one of a size of the pixel sensor (202) or a quantity of the air gap reflection structures (322, 522, 622, 722) to be formed for the pixel sensor (202).

In a third implementation, alone or in combination with one or more of the first and second implementations, the plurality of air gap reflection structures (322, 522, 622, 722) include a first plurality of air gap reflection structures (722a), and process 1000 includes forming (e.g., using the deposition tool 102, the exposure tool 104, the developer tool 106, the etch tool 108, and/or another semiconductor processing tool) a second plurality of air gap reflection structures (722c) in the ILD layer (720) for a second pixel sensor (202b) of the pixel array, wherein the second plurality of air gap reflection structures (722c) are adjacent to the first plurality of air gap reflection structures (722a), forming (e.g., using the deposition tool 102, the exposure tool 104, the developer tool 106, the etch tool 108, and/or another semiconductor processing tool) a third plurality of air gap reflection structures (722b) in the IMD layer (712), wherein the third plurality of air gap reflection structures (722b) are under the first plurality of air gap reflection structures (722a), and forming a fourth plurality of air gap reflection structures (722d) in the IMD layer (712), wherein the fourth plurality of air gap reflection structures (722d) are under the second plurality of air gap reflection structures (722c).

In a fourth implementation, alone or in combination with one or more of the first through third implementations, process 1000 includes forming (e.g., using the deposition tool 102, the exposure tool 104, the developer tool 106, the etch tool 108, and/or another semiconductor processing tool) a first DTI structure (328, 528, 628, 728) on a first side of the photodiode (326, 526, 626, 726) in the silicon layer (324, 524, 624, 724), and forming (e.g., using the deposition tool 102, the exposure tool 104, the developer tool 106, the etch tool 108, and/or another semiconductor processing tool) a second DTI structure on a second side (328, 528, 628, 728) of the photodiode (326, 526, 626, 726) in the silicon layer (324, 524, 624, 724). In a fifth implementation, alone or in combination with one or more of the first through fourth implementations, process 1000 includes forming (e.g., using the deposition tool 102, the exposure tool 104, the developer tool 106, the etch tool 108, and/or another semiconductor processing tool) a plurality of high absorption regions (330, 530, 630, 730) in the photodiode (326, 526, 626, 726) and in the silicon layer (324, 524, 624, 724).

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

In this way, a pixel array may include air gap reflection structures under a photodiode of a pixel sensor to reflect photons that would otherwise partially refract or scatter through a bottom surface of a photodiode. The air gap reflection structures may reflect photons upward toward the photodiode so that the photons may be absorbed by the photodiode. This may increase the quantity of photons absorbed by the photodiode, which may increase the quantum efficiency of the pixel sensor and the pixel array.

As described in greater detail above, some implementations described herein provide a pixel array. The pixel array includes a plurality of pixel sensors. A pixel sensor of the plurality of pixel sensors includes a photodiode in a silicon layer of the pixel array. The pixel sensor includes one or more air gap reflection structures below the photodiode and in an ILD layer that is below the silicon layer.

As described in greater detail above, some implementations described herein provide a pixel array. The pixel array includes a first pixel sensor including a first photodiode in a silicon layer of the pixel array. The first pixel sensor includes a first plurality of air gap reflection structures under the first photodiode and in an ILD layer that is below the silicon layer or an IMD layer that is below the ILD layer. The pixel array includes a second pixel sensor that includes a second photodiode in the silicon layer. The second pixel sensor includes a second plurality of air gap reflection structures under the second photodiode and in the ILD layer or the IMD layer.

As described in greater detail above, some implementations described herein provide a method. The method includes forming, for a pixel sensor of a pixel array included in an image sensor, a plurality of openings through an USG layer of the image sensor and in an ILD layer of the image sensor. The method includes forming an IMD layer on the USG layer, where the IMD layer closes the plurality of openings to form a plurality of air gap reflection structures. of the pixel sensor. The method includes forming a photodiode in a silicon layer above the ILD layer, where the photodiode is formed over the plurality of air gap reflection structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming, for a pixel sensor of a pixel array included in an image sensor, a plurality of openings through an undoped silicate glass (USG) layer of the image sensor and in an interlayer dielectric (ILD) layer of the image sensor;
    forming an inter-metal dielectric (IMD) layer on the USG layer,
        wherein the IMD layer closes the plurality of openings to form a first plurality of air gap reflection structures of the pixel sensor;
    forming a second plurality of air gap reflection structures in the IMD layer,
        wherein the second plurality of air gap reflection structures are under the first plurality of air gap reflection structures; and
    forming a photodiode in a silicon layer above the ILD layer,
        wherein the photodiode is formed over the first plurality of air gap reflection structures.

2. The method of claim 1, wherein forming the plurality of openings comprises:
    forming a quantity of the plurality of openings based on a size of the pixel sensor.

3. The method of claim 1, wherein forming the plurality of openings comprises:
    forming each of the plurality of openings to at least one of a particular depth or a particular width based on at least one of:
        a size of the pixel sensor, or
        a quantity of the first plurality of air gap reflection structures to be formed for the pixel sensor.

4. The method of claim 1, wherein the pixel sensor is a first pixel sensor; and
    wherein the method further comprises:
        forming a third plurality of air gap reflection structures in the ILD layer for a second pixel sensor of the pixel array,
            wherein the third plurality of air gap reflection structures are adjacent to the first plurality of air gap reflection structures; and
        forming a fourth plurality of air gap reflection structures in the IMD layer,
            wherein the fourth plurality of air gap reflection structures are under the third plurality of air gap reflection structures.

5. The method of claim 1, further comprising:
    forming a first deep trench isolation (DTI) structure on a first side of the photodiode in the silicon layer; and
    forming a second DTI structure on a second side of the photodiode in the silicon layer.

6. The method of claim 5, further comprising:
    forming a plurality of high absorption regions in the photodiode and in the silicon layer.

7. The method of claim 1, wherein the first plurality of air gap reflection structures are formed to have an aspect ratio, between a depth of an air gap reflection structure of the first plurality of air gap reflection structures and a width of the air gap reflection structure, greater than approximately 2.

8. A system, comprising:
    one or more semiconductor processing tools configured to:

form, for a pixel sensor of a pixel array included in an image sensor, a plurality of openings through an un-doped silicate glass (USG) layer of the image sensor and in an interlayer dielectric (ILD) layer of the image sensor;

form an inter-metal dielectric (IMD) layer on the USG layer,
  wherein the IMD layer closes the plurality of openings to form a first plurality of air gap reflection structures of the pixel sensor;

form a second plurality of air gap reflection structures in the IMD layer,
  wherein the second plurality of air gap reflection structures are under the first plurality of air gap reflection structures; and form a photodiode in a silicon layer above the ILD layer,
  wherein the photodiode is formed over the first plurality of air gap reflection structures.

9. The system of claim 8, wherein the one or more semiconductor processing tools, to form the plurality of openings, are configured to:
  form a quantity of the plurality of openings based on a size of the pixel sensor.

10. The system of claim 8, wherein the one or more semiconductor processing tools, to form the plurality of openings, are configured to:
  form each of the plurality of openings to at least one of a particular depth or a particular width based on at least one of:
    a size of the pixel sensor, or
    a quantity of the first plurality of air gap reflection structures to be formed for the pixel sensor.

11. The system of claim 8, wherein the pixel sensor is a first pixel sensor; and
  wherein the one or more semiconductor processing tools are further configured to:
    form a third plurality of air gap reflection structures in the ILD layer for a second pixel sensor of the pixel array,
      wherein the third plurality of air gap reflection structures are adjacent to the first plurality of air gap reflection structures; and
    form a fourth plurality of air gap reflection structures in the IMD layer,
      wherein the fourth plurality of air gap reflection structures are under the third plurality of air gap reflection structures.

12. The system of claim 8, wherein the one or more semiconductor processing tools are further configured to:
  form a first deep trench isolation (DTI) structure on a first side of the photodiode in the silicon layer; and
  form a second DTI structure on a second side of the photodiode in the silicon layer.

13. The system of claim 12, wherein the one or more semiconductor processing tools are further configured to:
  form a plurality of high absorption regions in the photodiode and in the silicon layer.

14. The system of claim 8, wherein the first plurality of air gap reflection structures are formed to have an aspect ratio, between a depth of an air gap reflection structure of the first plurality of air gap reflection structures and a width of the air gap reflection structure, greater than approximately 2.

15. A method, comprising:
  forming, for a pixel sensor of a pixel array included in an image sensor, a plurality of openings through an un-doped silicate glass (USG) layer of the image sensor and in an interlayer dielectric (ILD) layer of the image sensor;
  forming an inter-metal dielectric (IMD) layer on the USG layer,
    wherein the IMD layer closes the plurality of openings to form a plurality of air gap reflection structures of the pixel sensor, and
    wherein the plurality of air gap reflection structures are formed to have an aspect ratio, between a depth of an air gap reflection structure of the plurality of air gap reflection structures and a width of the air gap reflection structure, greater than approximately 2; and
  forming a photodiode in a silicon layer above the ILD layer,
    wherein the photodiode is formed over the plurality of air gap reflection structures.

16. The method of claim 15, wherein forming the plurality of openings comprises:
  forming a quantity of the plurality of openings based on a size of the pixel sensor.

17. The method of claim 15, wherein forming the plurality of openings comprises:
  forming each of the plurality of openings to at least one of a particular depth or a particular width based on at least one of:
    a size of the pixel sensor, or
    a quantity of the plurality of air gap reflection structures to be formed for the pixel sensor.

18. The method of claim 15, wherein the plurality of air gap reflection structures comprise a first plurality of air gap reflection structures, and the pixel sensor is a first pixel sensor; and
  wherein the method further comprises:
    forming a second plurality of air gap reflection structures in the ILD layer for a second pixel sensor of the pixel array,
      wherein the second plurality of air gap reflection structures are adjacent to the first plurality of air gap reflection structures;
    forming a third plurality of air gap reflection structures in the IMD layer,
      wherein the third plurality of air gap reflection structures are under the first plurality of air gap reflection structures; and
    forming a fourth plurality of air gap reflection structures in the IMD layer,
      wherein the fourth plurality of air gap reflection structures are under the second plurality of air gap reflection structures.

19. The method of claim 15, further comprising:
  forming a first deep trench isolation (DTI) structure on a first side of the photodiode in the silicon layer; and
  forming a second DTI structure on a second side of the photodiode in the silicon layer.

20. The method of claim 19, further comprising:
  forming a plurality of high absorption regions in the photodiode and in the silicon layer.

* * * * *